(12) United States Patent
Jeon et al.

(10) Patent No.: US 9,159,437 B2
(45) Date of Patent: Oct. 13, 2015

(54) DEVICE AND METHOD FOR RESOLVING AN LM FLAG ISSUE

(71) Applicant: SanDisk Enterprise IP LLC, Milpitas, CA (US)

(72) Inventors: Seungjune Jeon, Milpitas, CA (US); Charles Kwong, Redwood City, CA (US); Jiangli Zhu, Sunnyvale, CA (US)

(73) Assignee: SANDISK ENTERPRISE IP LLC., Milpitas, CA (US)

( * ) Notice: Subject to any disclaimer, the term of this patent is extended or adjusted under 35 U.S.C. 154(b) by 140 days.

(21) Appl. No.: 13/924,313

(22) Filed: Jun. 21, 2013

(65) Prior Publication Data

US 2014/0365836 A1  Dec. 11, 2014

Related U.S. Application Data

(60) Provisional application No. 61/833,888, filed on Jun. 11, 2013.

(51) Int. Cl.
*G11C 29/00* (2006.01)
*G11C 16/26* (2006.01)
(Continued)

(52) U.S. Cl.
CPC .............. *G11C 16/26* (2013.01); *G11C 29/021* (2013.01); *G11C 29/028* (2013.01); *G11C 11/5642* (2013.01)

(58) Field of Classification Search
CPC .. G11C 16/26; G11C 29/021; G11C 11/5642; G11C 29/028
USPC .................................. 714/100, E11.001, 721
See application file for complete search history.

(56) References Cited

U.S. PATENT DOCUMENTS 4,173,737 A   11/1979   Skerlos et al.
4,888,750 A   12/1989   Kryder et al.
(Continued)

FOREIGN PATENT DOCUMENTS

EP    1 299 800       4/2003
EP    1465203 A1     10/2004
(Continued)

OTHER PUBLICATIONS

International Search Report and Written Opinion dated Jul. 25, 2014, received in International Patent Application No. PCT/US2014/029453, which corresponds to U.S. Appl. No. 13/963,444, 9 pages (Frayer).

(Continued)

*Primary Examiner* — Han Yang
*Assistant Examiner* — Xiaochun L Chen
(74) *Attorney, Agent, or Firm* — Morgan, Lewis & Bockius LLP

(57) ABSTRACT

The reliability with which data can be read from a storage medium, such as flash memory storage medium, is enhanced by updating an upper limit of a reading threshold voltage window for a respective portion of the storage medium. For each memory cell in the respective portion of the storage medium, a memory controller is configured to perform a plurality of sensing operations and obtain results from the plurality of sensing operations, where the plurality of sensing operations includes sensing operations using a predefined range of offsets from a previously established reading threshold voltage. The memory controller is further configured to determine the updated upper limit of the reading threshold voltage window based on the-results from the plurality of sensing operations, and store the updated upper limit of the reading threshold voltage window for the respective portion of the storage medium.

29 Claims, 16 Drawing Sheets

(51) Int. Cl.
*G11C 29/02* (2006.01)
*G11C 11/56* (2006.01)

(56) References Cited

U.S. PATENT DOCUMENTS

| | | |
|---|---|---|
| 4,916,652 A | 4/1990 | Schwarz et al. |
| 5,129,089 A | 7/1992 | Nielsen |
| 5,270,979 A | 12/1993 | Harari et al. |
| 5,329,491 A | 7/1994 | Brown et al. |
| 5,519,847 A | 5/1996 | Fandrich et al. |
| 5,530,705 A | 6/1996 | Malone, Sr. |
| 5,537,555 A | 7/1996 | Landry et al. |
| 5,551,003 A | 8/1996 | Mattson et al. |
| 5,657,332 A | 8/1997 | Auclair et al. |
| 5,666,114 A | 9/1997 | Brodie et al. |
| 5,708,849 A | 1/1998 | Coke et al. |
| 5,765,185 A | 6/1998 | Lambrache et al. |
| 5,890,193 A | 3/1999 | Chevalier |
| 5,936,884 A | 8/1999 | Hasbun et al. |
| 5,943,692 A | 8/1999 | Marberg et al. |
| 5,982,664 A | 11/1999 | Watanabe |
| 6,000,006 A | 12/1999 | Bruce et al. |
| 6,006,345 A | 12/1999 | Berry, Jr. |
| 6,016,560 A | 1/2000 | Wada et al. |
| 6,018,304 A | 1/2000 | Bessios |
| 6,070,074 A | 5/2000 | Perahia et al. |
| 6,138,261 A | 10/2000 | Wilcoxson et al. |
| 6,182,264 B1 | 1/2001 | Ott |
| 6,192,092 B1 | 2/2001 | Dizon et al. |
| 6,295,592 B1 | 9/2001 | Jeddeloh |
| 6,311,263 B1 | 10/2001 | Barlow et al. |
| 6,412,042 B1 | 6/2002 | Paterson et al. |
| 6,442,076 B1 | 8/2002 | Roohparvar |
| 6,449,625 B1 | 9/2002 | Wang |
| 6,484,224 B1 | 11/2002 | Robins et al. |
| 6,516,437 B1 | 2/2003 | Van Stralen et al. |
| 6,564,285 B1 | 5/2003 | Mills et al. |
| 6,678,788 B1 | 1/2004 | O'Connell |
| 6,757,768 B1 | 6/2004 | Potter et al. |
| 6,775,792 B2 | 8/2004 | Ulrich et al. |
| 6,810,440 B2 | 10/2004 | Micalizzi, Jr. et al. |
| 6,836,808 B2 | 12/2004 | Bunce et al. |
| 6,836,815 B1 | 12/2004 | Purcell et al. |
| 6,842,436 B2 | 1/2005 | Moeller |
| 6,865,650 B1 | 3/2005 | Morley et al. |
| 6,871,257 B2 | 3/2005 | Conley et al. |
| 6,895,464 B2 | 5/2005 | Chow et al. |
| 6,978,343 B1 | 12/2005 | Ichiriu |
| 6,980,985 B1 | 12/2005 | Amer-Yahia et al. |
| 6,981,205 B2 | 12/2005 | Fukushima et al. |
| 6,988,171 B2 | 1/2006 | Beardsley et al. |
| 7,020,017 B2 | 3/2006 | Chen et al. |
| 7,028,165 B2 | 4/2006 | Roth et al. |
| 7,032,123 B2 | 4/2006 | Kane et al. |
| 7,043,505 B1 | 5/2006 | Teague et al. |
| 7,076,598 B2 | 7/2006 | Wang |
| 7,100,002 B2 | 8/2006 | Shrader |
| 7,111,293 B1 | 9/2006 | Hersh et al. |
| 7,126,873 B2 | 10/2006 | See et al. |
| 7,162,678 B2 | 1/2007 | Saliba |
| 7,173,852 B2 | 2/2007 | Gorobets et al. |
| 7,184,446 B2 | 2/2007 | Rashid et al. |
| 7,328,377 B1 | 2/2008 | Lewis et al. |
| 7,516,292 B2 | 4/2009 | Kimura et al. |
| 7,523,157 B2 | 4/2009 | Aguilar, Jr. et al. |
| 7,527,466 B2 | 5/2009 | Simmons |
| 7,529,466 B2 | 5/2009 | Takahashi |
| 7,533,214 B2 | 5/2009 | Aasheim et al. |
| 7,571,277 B2 | 8/2009 | Mizushima |
| 7,574,554 B2 | 8/2009 | Tanaka et al. |
| 7,596,643 B2 | 9/2009 | Merry, Jr. et al. |
| 7,681,106 B2 | 3/2010 | Jarrar et al. |
| 7,685,494 B1 | 3/2010 | Varnica et al. |
| 7,707,481 B2 | 4/2010 | Kirschner et al. |
| 7,761,655 B2 | 7/2010 | Mizushima et al. |
| 7,765,454 B2 | 7/2010 | Passint |
| 7,774,390 B2 | 8/2010 | Shin |
| 7,840,762 B2 | 11/2010 | Oh et al. |
| 7,870,326 B2 | 1/2011 | Shin et al. |
| 7,890,818 B2 | 2/2011 | Kong et al. |
| 7,913,022 B1 | 3/2011 | Baxter |
| 7,925,960 B2 | 4/2011 | Ho et al. |
| 7,934,052 B2 | 4/2011 | Prins et al. |
| 7,945,825 B2 | 5/2011 | Cohen et al. |
| 7,954,041 B2 | 5/2011 | Hong et al. |
| 7,971,112 B2 | 6/2011 | Murata |
| 7,974,368 B2 | 7/2011 | Shieh et al. |
| 7,978,516 B2 | 7/2011 | Olbrich et al. |
| 7,996,642 B1 | 8/2011 | Smith |
| 8,006,161 B2 | 8/2011 | Lestable et al. |
| 8,032,724 B1 | 10/2011 | Smith |
| 8,041,884 B2 | 10/2011 | Chang |
| 8,042,011 B2 | 10/2011 | Nicolaidis et al. |
| 8,069,390 B2 | 11/2011 | Lin |
| 8,190,967 B2 | 5/2012 | Hong et al. |
| 8,250,380 B2 | 8/2012 | Guyot |
| 8,254,181 B2 | 8/2012 | Hwang et al. |
| 8,259,506 B1 | 9/2012 | Sommer et al. |
| 8,312,349 B2 | 11/2012 | Reche et al. |
| 8,412,985 B1 | 4/2013 | Bowers et al. |
| 8,429,436 B2 | 4/2013 | Fillingim et al. |
| 8,438,459 B2 | 5/2013 | Cho et al. |
| 8,453,022 B2 | 5/2013 | Katz |
| 8,634,248 B1 | 1/2014 | Sprouse et al. |
| 8,694,854 B1 * | 4/2014 | Dar et al. ............... 714/763 |
| 8,724,789 B2 | 5/2014 | Altberg et al. |
| 8,885,434 B2 | 11/2014 | Kumar |
| 8,898,373 B1 | 11/2014 | Kang et al. |
| 8,910,030 B2 | 12/2014 | Goel |
| 8,923,066 B1 | 12/2014 | Subramanian et al. |
| 2001/0050824 A1 | 12/2001 | Buch |
| 2002/0024846 A1 | 2/2002 | Kawahara et al. |
| 2002/0083299 A1 | 6/2002 | Van Huben et al. |
| 2002/0122334 A1 | 9/2002 | Lee et al. |
| 2002/0152305 A1 | 10/2002 | Jackson et al. |
| 2002/0162075 A1 | 10/2002 | Talagala et al. |
| 2002/0165896 A1 | 11/2002 | Kim |
| 2003/0041299 A1 | 2/2003 | Kanazawa et al. |
| 2003/0043829 A1 | 3/2003 | Rashid et al. |
| 2003/0088805 A1 | 5/2003 | Majni et al. |
| 2003/0093628 A1 | 5/2003 | Matter et al. |
| 2003/0163594 A1 | 8/2003 | Aasheim et al. |
| 2003/0163629 A1 | 8/2003 | Conley et al. |
| 2003/0188045 A1 | 10/2003 | Jacobson |
| 2003/0189856 A1 | 10/2003 | Cho et al. |
| 2003/0198100 A1 | 10/2003 | Matsushita et al. |
| 2003/0204341 A1 | 10/2003 | Guliani et al. |
| 2003/0212719 A1 | 11/2003 | Yasuda et al. |
| 2004/0024957 A1 | 2/2004 | Lin et al. |
| 2004/0024963 A1 | 2/2004 | Talagala et al. |
| 2004/0057575 A1 | 3/2004 | Zhang et al. |
| 2004/0062157 A1 | 4/2004 | Kawabe |
| 2004/0073829 A1 | 4/2004 | Olarig |
| 2004/0114265 A1 | 6/2004 | Talbert |
| 2004/0143710 A1 | 7/2004 | Walmsley |
| 2004/0148561 A1 | 7/2004 | Shen et al. |
| 2004/0153902 A1 | 8/2004 | Machado et al. |
| 2004/0167898 A1 | 8/2004 | Margolus et al. |
| 2004/0181734 A1 | 9/2004 | Saliba |
| 2004/0199714 A1 | 10/2004 | Estakhri et al. |
| 2004/0237018 A1 | 11/2004 | Riley |
| 2005/0060456 A1 | 3/2005 | Shrader et al. |
| 2005/0060501 A1 | 3/2005 | Shrader |
| 2005/0073884 A1 | 4/2005 | Gonzalez et al. |
| 2005/0114587 A1 | 5/2005 | Chou et al. |
| 2005/0172065 A1 | 8/2005 | Keays |
| 2005/0172207 A1 | 8/2005 | Radke et al. |
| 2005/0193161 A1 | 9/2005 | Lee et al. |
| 2005/0201148 A1 | 9/2005 | Chen et al. |
| 2005/0231765 A1 | 10/2005 | So et al. |
| 2005/0249013 A1 | 11/2005 | Janzen et al. |
| 2005/0251617 A1 | 11/2005 | Sinclair et al. |
| 2005/0257120 A1 | 11/2005 | Gorobets et al. |
| 2005/0273560 A1 | 12/2005 | Hulbert et al. |

(56) References Cited

U.S. PATENT DOCUMENTS

| | | |
|---|---|---|
| 2005/0289314 A1 | 12/2005 | Adusumilli et al. |
| 2006/0010174 A1 | 1/2006 | Nguyen et al. |
| 2006/0039196 A1 | 2/2006 | Gorobets et al. |
| 2006/0039227 A1 | 2/2006 | Lai et al. |
| 2006/0053246 A1 | 3/2006 | Lee |
| 2006/0085671 A1 | 4/2006 | Majni et al. |
| 2006/0087893 A1 | 4/2006 | Nishihara et al. |
| 2006/0107181 A1 | 5/2006 | Dave et al. |
| 2006/0136570 A1 | 6/2006 | Pandya |
| 2006/0136681 A1 | 6/2006 | Jain et al. |
| 2006/0156177 A1 | 7/2006 | Kottapalli et al. |
| 2006/0195650 A1 | 8/2006 | Su et al. |
| 2006/0244049 A1 | 11/2006 | Yaoi et al. |
| 2006/0259528 A1 | 11/2006 | Dussud et al. |
| 2006/0291301 A1 | 12/2006 | Ziegelmayer |
| 2007/0011413 A1 | 1/2007 | Nonaka et al. |
| 2007/0058446 A1 | 3/2007 | Hwang et al. |
| 2007/0061597 A1 | 3/2007 | Holtzman et al. |
| 2007/0076479 A1 | 4/2007 | Kim et al. |
| 2007/0081408 A1 | 4/2007 | Kwon et al. |
| 2007/0083697 A1 | 4/2007 | Birrell et al. |
| 2007/0088716 A1 | 4/2007 | Brumme et al. |
| 2007/0091677 A1 | 4/2007 | Lasser et al. |
| 2007/0113019 A1 | 5/2007 | Beukema et al. |
| 2007/0133312 A1 | 6/2007 | Roohparvar |
| 2007/0147113 A1 | 6/2007 | Mokhlesi et al. |
| 2007/0150790 A1 | 6/2007 | Gross et al. |
| 2007/0156842 A1 | 7/2007 | Vermeulen et al. |
| 2007/0157064 A1 | 7/2007 | Falik et al. |
| 2007/0174579 A1 | 7/2007 | Shin |
| 2007/0180188 A1 | 8/2007 | Fujibayashi et al. |
| 2007/0180346 A1 | 8/2007 | Murin |
| 2007/0201274 A1 | 8/2007 | Yu et al. |
| 2007/0208901 A1 | 9/2007 | Purcell et al. |
| 2007/0234143 A1 | 10/2007 | Kim |
| 2007/0245061 A1 | 10/2007 | Harriman |
| 2007/0245099 A1 | 10/2007 | Gray et al. |
| 2007/0263442 A1 | 11/2007 | Cornwell et al. |
| 2007/0277036 A1 | 11/2007 | Chamberlain et al. |
| 2007/0279988 A1 | 12/2007 | Nguyen |
| 2007/0291556 A1 | 12/2007 | Kamei |
| 2007/0294496 A1 | 12/2007 | Goss et al. |
| 2007/0300130 A1 | 12/2007 | Gorobets |
| 2008/0019182 A1 | 1/2008 | Yanagidaira et al. |
| 2008/0022163 A1 | 1/2008 | Tanaka et al. |
| 2008/0028275 A1 | 1/2008 | Chen et al. |
| 2008/0043871 A1 | 2/2008 | Latouche et al. |
| 2008/0052446 A1 | 2/2008 | Lasser et al. |
| 2008/0056005 A1 | 3/2008 | Aritome |
| 2008/0071971 A1 | 3/2008 | Kim et al. |
| 2008/0077841 A1 | 3/2008 | Gonzalez et al. |
| 2008/0077937 A1 | 3/2008 | Shin et al. |
| 2008/0086677 A1 | 4/2008 | Yang et al. |
| 2008/0112226 A1 | 5/2008 | Mokhlesi |
| 2008/0141043 A1 | 6/2008 | Flynn et al. |
| 2008/0144371 A1 | 6/2008 | Yeh et al. |
| 2008/0147714 A1 | 6/2008 | Breternitz et al. |
| 2008/0147964 A1 | 6/2008 | Chow et al. |
| 2008/0147998 A1 | 6/2008 | Jeong |
| 2008/0148124 A1 | 6/2008 | Zhang et al. |
| 2008/0163030 A1 | 7/2008 | Lee |
| 2008/0168191 A1 | 7/2008 | Biran et al. |
| 2008/0168319 A1 | 7/2008 | Lee et al. |
| 2008/0170460 A1 | 7/2008 | Oh et al. |
| 2008/0229000 A1 | 9/2008 | Kim |
| 2008/0229003 A1 | 9/2008 | Mizushima et al. |
| 2008/0229176 A1 | 9/2008 | Arnez et al. |
| 2008/0270680 A1 | 10/2008 | Chang |
| 2008/0282128 A1 | 11/2008 | Lee et al. |
| 2008/0285351 A1 | 11/2008 | Shlick et al. |
| 2008/0313132 A1 | 12/2008 | Hao et al. |
| 2009/0003058 A1 | 1/2009 | Kang |
| 2009/0019216 A1 | 1/2009 | Yamada et al. |
| 2009/0031083 A1 | 1/2009 | Willis et al. |
| 2009/0037652 A1 | 2/2009 | Yu et al. |
| 2009/0116283 A1 | 5/2009 | Ha et al. |
| 2009/0125671 A1 | 5/2009 | Flynn et al. |
| 2009/0144598 A1 | 6/2009 | Yoon et al. |
| 2009/0168525 A1 | 7/2009 | Olbrich et al. |
| 2009/0172258 A1 | 7/2009 | Olbrich et al. |
| 2009/0172259 A1 | 7/2009 | Prins et al. |
| 2009/0172260 A1 | 7/2009 | Olbrich et al. |
| 2009/0172261 A1 | 7/2009 | Prins et al. |
| 2009/0172262 A1 | 7/2009 | Olbrich et al. |
| 2009/0172308 A1 | 7/2009 | Prins et al. |
| 2009/0172335 A1 | 7/2009 | Kulkarni et al. |
| 2009/0172499 A1 | 7/2009 | Olbrich et al. |
| 2009/0193058 A1 | 7/2009 | Reid |
| 2009/0207660 A1 | 8/2009 | Hwang et al. |
| 2009/0222708 A1 | 9/2009 | Yamaga |
| 2009/0249160 A1 | 10/2009 | Gao et al. |
| 2009/0268521 A1 | 10/2009 | Ueno et al. |
| 2009/0292972 A1 | 11/2009 | Seol et al. |
| 2009/0296466 A1 | 12/2009 | Kim et al. |
| 2009/0296486 A1 | 12/2009 | Kim et al. |
| 2009/0310422 A1 | 12/2009 | Edahiro et al. |
| 2009/0319864 A1 | 12/2009 | Shrader |
| 2010/0002506 A1 | 1/2010 | Cho et al. |
| 2010/0008175 A1 | 1/2010 | Sweere et al. |
| 2010/0011261 A1 | 1/2010 | Cagno et al. |
| 2010/0020620 A1 | 1/2010 | Kim et al. |
| 2010/0037012 A1 | 2/2010 | Yano et al. |
| 2010/0061151 A1 | 3/2010 | Miwa et al. |
| 2010/0091535 A1 | 4/2010 | Sommer et al. |
| 2010/0103737 A1 | 4/2010 | Park |
| 2010/0110798 A1 | 5/2010 | Hoei et al. |
| 2010/0118608 A1 | 5/2010 | Song et al. |
| 2010/0138592 A1 | 6/2010 | Cheon |
| 2010/0153616 A1 | 6/2010 | Garratt |
| 2010/0161936 A1 | 6/2010 | Royer et al. |
| 2010/0174959 A1 | 7/2010 | No et al. |
| 2010/0199125 A1 | 8/2010 | Reche |
| 2010/0199138 A1 | 8/2010 | Rho |
| 2010/0202196 A1 | 8/2010 | Lee et al. |
| 2010/0208521 A1 | 8/2010 | Kim et al. |
| 2010/0262889 A1 | 10/2010 | Bains |
| 2010/0281207 A1 | 11/2010 | Miller et al. |
| 2010/0281342 A1 | 11/2010 | Chang et al. |
| 2011/0010514 A1 | 1/2011 | Benhase et al. |
| 2011/0051513 A1 | 3/2011 | Shen et al. |
| 2011/0066597 A1 | 3/2011 | Mashtizadeh et al. |
| 2011/0078407 A1 | 3/2011 | Lewis |
| 2011/0083060 A1 | 4/2011 | Sakurada et al. |
| 2011/0099460 A1 | 4/2011 | Dusija et al. |
| 2011/0113281 A1 | 5/2011 | Zhang et al. |
| 2011/0122691 A1 | 5/2011 | Sprouse |
| 2011/0131444 A1 | 6/2011 | Buch et al. |
| 2011/0173378 A1 | 7/2011 | Filor et al. |
| 2011/0179249 A1 | 7/2011 | Hsiao |
| 2011/0199825 A1 | 8/2011 | Han et al. |
| 2011/0205823 A1 | 8/2011 | Hemink et al. |
| 2011/0213920 A1 | 9/2011 | Frost et al. |
| 2011/0222342 A1 | 9/2011 | Yoon et al. |
| 2011/0228601 A1 | 9/2011 | Olbrich et al. |
| 2011/0231600 A1 | 9/2011 | Tanaka et al. |
| 2011/0271040 A1 | 11/2011 | Kamizono |
| 2012/0023144 A1 | 1/2012 | Rub |
| 2012/0054414 A1 | 3/2012 | Tsai et al. |
| 2012/0063234 A1 | 3/2012 | Shiga et al. |
| 2012/0072639 A1 | 3/2012 | Goss et al. |
| 2012/0096217 A1 | 4/2012 | Son et al. |
| 2012/0110250 A1 | 5/2012 | Sabbag et al. |
| 2012/0151124 A1 | 6/2012 | Baek et al. |
| 2012/0151253 A1 | 6/2012 | Horn |
| 2012/0151294 A1 | 6/2012 | Yoo et al. |
| 2012/0185750 A1 | 7/2012 | Hayami |
| 2012/0195126 A1 | 8/2012 | Roohparvar |
| 2012/0203951 A1 | 8/2012 | Wood et al. |
| 2012/0216079 A1 | 8/2012 | Fai et al. |
| 2012/0233391 A1 | 9/2012 | Frost et al. |
| 2012/0236658 A1 | 9/2012 | Byom et al. |
| 2012/0239858 A1 | 9/2012 | Melik-Martirosian |
| 2012/0239976 A1 | 9/2012 | Cometti et al. |
| 2012/0259863 A1 | 10/2012 | Bodwin et al. |

(56) References Cited

U.S. PATENT DOCUMENTS

| | | |
|---|---|---|
| 2012/0275466 A1 | 11/2012 | Bhadra et al. |
| 2012/0278564 A1 | 11/2012 | Goss et al. |
| 2012/0284587 A1 | 11/2012 | Yu et al. |
| 2013/0007073 A1 | 1/2013 | Varma |
| 2013/0007543 A1 | 1/2013 | Goss et al. |
| 2013/0024735 A1 | 1/2013 | Chung et al. |
| 2013/0031438 A1 | 1/2013 | Hu et al. |
| 2013/0036418 A1 | 2/2013 | Yadappanavar et al. |
| 2013/0047045 A1 | 2/2013 | Hu et al. |
| 2013/0073924 A1 | 3/2013 | D'Abreu et al. |
| 2013/0086131 A1 | 4/2013 | Hunt et al. |
| 2013/0086132 A1 | 4/2013 | Hunt et al. |
| 2013/0094288 A1 | 4/2013 | Patapoutian et al. |
| 2013/0111279 A1 | 5/2013 | Jeon et al. |
| 2013/0111298 A1 | 5/2013 | Seroff et al. |
| 2013/0121084 A1 | 5/2013 | Jeon et al. |
| 2013/0124888 A1 | 5/2013 | Tanaka et al. |
| 2013/0128666 A1 | 5/2013 | Avila et al. |
| 2013/0132652 A1 | 5/2013 | Wood et al. |
| 2013/0176784 A1 | 7/2013 | Cometti et al. |
| 2013/0179646 A1 | 7/2013 | Okubo et al. |
| 2013/0191601 A1 | 7/2013 | Peterson et al. |
| 2013/0194874 A1 | 8/2013 | Mu et al. |
| 2013/0232289 A1 | 9/2013 | Zhong et al. |
| 2013/0258738 A1 | 10/2013 | Barkon et al. |
| 2013/0265838 A1 | 10/2013 | Li |
| 2013/0290611 A1 | 10/2013 | Biederman et al. |
| 2013/0301373 A1 | 11/2013 | Tam |
| 2013/0304980 A1 | 11/2013 | Nachimuthu et al. |
| 2013/0343131 A1 | 12/2013 | Wu et al. |
| 2014/0013188 A1 | 1/2014 | Wu et al. |
| 2014/0063905 A1 | 3/2014 | Ahn et al. |
| 2014/0075133 A1 | 3/2014 | Li et al. |
| 2014/0082261 A1 | 3/2014 | Cohen et al. |
| 2014/0082456 A1 | 3/2014 | Liu |
| 2014/0095775 A1 | 4/2014 | Talagala et al. |
| 2014/0122818 A1 | 5/2014 | Hayasaka et al. |
| 2014/0136927 A1 | 5/2014 | Li et al. |
| 2014/0143505 A1 | 5/2014 | Sim et al. |
| 2014/0201596 A1 | 7/2014 | Baum et al. |
| 2014/0223084 A1 | 8/2014 | Lee et al. |
| 2014/0258755 A1 | 9/2014 | Stenfort |
| 2014/0269090 A1 | 9/2014 | Flynn et al. |
| 2014/0359381 A1 | 12/2014 | Takeuchi et al. |

FOREIGN PATENT DOCUMENTS

| | | |
|---|---|---|
| EP | 2 386 958 A1 | 11/2011 |
| EP | 2 620 946 A2 | 7/2013 |
| JP | 2002-532806 S | 10/2002 |
| WO | WO 2007/036834 A2 | 4/2007 |
| WO | WO 2007/080586 A2 | 7/2007 |
| WO | WO 2008/075292 A2 | 6/2008 |
| WO | WO 2008/121553 | 10/2008 |
| WO | WO 2008/121577 | 10/2008 |
| WO | WO 2009/028281 A1 | 3/2009 |
| WO | WO 2009/032945 A1 | 3/2009 |
| WO | WO 2009/058140 A1 | 5/2009 |
| WO | WO 2009/084724 | 7/2009 |
| WO | WO 2009/134576 AI | 11/2009 |
| WO | WO 2011/024015 | 3/2011 |

OTHER PUBLICATIONS

International Search Report and Written Opinion dated Mar. 7, 2014, received in International Patent Application No. PCT/US2013/074772, which corresponds to U.S. Appl. No. 13/831,218, 10 pages (George).

International Search Report and Written Opinion dated Mar. 24, 2014, received in International Patent Application No. PCT/US2013/074777, which corresponds to U.S. Appl. No, 13/831,308, 10 pages (George).

International Search Report and Written Opinion dated Mar. 7, 2014, received in International Patent Application No. PCT/US2013/074779, which corresponds to U.S. Appl. No. 13/831,374, 8 pages (George).

Barr, Introduction to Watchdog Timers, Oct. 2001, 3 pgs.

Kang, A Multi-Channel Architecture for High-Performance NAND Flash-Based Storage System, J. Syst. Archit., 53, 9, Sep. 2007, 15 pgs.

Kim, A Space-Efficient Flash Translation Layer for CompactFlash Systems, May 2002, 10 pgs.

McLean, Information Technology-AT Attachment with Packet Interface Extension, Aug. 19, 1998, 339 pgs.

Park, A High Performance Controller for NAND Flash-Based Solid State Disk (NSSD), Feb. 12-16, 2006, 4 pgs.

Pliant Technology, International Search Report / Written Opinion, PCT/US08/88133, Mar. 19, 2009, 7 pgs.

Pliant Technology, International Search Report / Written Opinion, PCT/US08/88136, Mar. 19, 2009, 7 pgs.

Pliant Technology, International Search Report / Written Opinion, PCT/US08/88146, Feb. 26, 2009, 10 pgs.

Pliant Technology, International Search Report / Written Opinion, PCT/US08/88154, Feb. 27, 2009, 9 pgs.

Pliant Technology, International Search Report / Written Opinion, PCT/US08/88164, Feb. 13, 2009, 6 pgs.

Pliant Technology, International Search Report / Written Opinion, PCT/US08/88206, Feb. 18, 2009, 8 pgs.

Pliant Technology, International Search Report / Written Opinion, PCT/US08/88217, Feb. 19, 2009, 7 pgs.

Pliant Technology, International Search Report / Written Opinion, PCT/US08/88229, Feb. 13, 2009, 8 pgs.

Pliant Technology, International Search Report / Written Opinion, PCT/US08/88232, Feb. 19, 2009, 8 pgs.

Pliant Technology, International Search Report / Written Opinion, PCT/US08/88236, Feb. 19, 2009, 7 pgs.

Pliant Technology, International Search Report / Written Opinion, PCT/US2011/028637, Oct. 27, 2011, 11 pgs.

Pliant Technology, Supplementary ESR, 08866997.3, Feb. 23, 2012, 6 pgs.

SanDisk Enterprise IP LLC, International Search Report / Written Opinion, PCT/US2012/042764, Aug. 31, 2012, 12 pgs.

Sandisk Enterprise IP LLC, International Search Report / Written Opinion, PCT/US2012/042771, Mar. 4, 2013, 14 pgs.

SanDisk Enterprise IP LLC, International Search Report / Written Opinion, PCT/US2012/042775, Sep. 26, 2012, 8 pgs.

SanDisk Enterprise IP LLC, International Search Report / Written Opinion, PCT/US2012/059447, Jun. 6, 2013, 12 pgs.

SanDisk Enterprise IP LLC, International Search Report / Written Opinion, PCT/US2012/059453, Jun. 6, 2013, 12 pgs.

Sandisk Enterprise IP LLC, International Search Report / Written Opinion, PCT/US2012/059459, Feb. 14, 2013, 9 pgs.

SanDisk Enterprise IP LLC, International Search Report / Written Opinion, PCT/US2012/065914, May 23, 2013, 7 pgs.

SanDisk Enterprise IP LLC, International Search Report / Written Opinion, PCT/US2012/065916, Apr. 5, 2013, 7 pgs.

SanDisk Enterprise IP LLC, International Search Report / Written Opinion, PCT/US2012/065919, Jun. 17, 2013, 8 pgs.

SanDisk Enterprise IP LLC, Office Action, CN 200880127623.8, Apr. 18, 2012, 12 pgs.

SanDisk Enterprise IP LLC, Office Action, CN 200880127623.8, Dec. 31, 2012, 9 pgs.

SanDisk Enterprise IP LLC, Office Action, JP 2010-540863, Jul. 24, 2012, 3 pgs.

Watchdog Timer and Power Savin Modes, Microchip Technology Inc., 2005.

Zeidman, 1999 Verilog Designer's Library, 9 pgs.

Canim, Buffered Bloom ilters on Solid State Storage, ADMS 10, Singapore, Sep. 13-17, 2010, 8 pgs.

Lu, A Forest-structured Bloom Filter with Flash Memory, MSST 2011, Denver, CO, May 23- 27, 2011, article, 6 pgs.

Lu, A Forest-structured Bloom Filter with Flash Memory, MSST 2011, Denver, CO, May 23-27, 2011, presentation slides, 25 pgs.

SanDisk Enterprise IP LLC, Notification of the Decision to Grant a Patent Right for Patent for Invention, CN 200880127623.8, Jul. 4, 2013, 1 pg.

(56) References Cited

OTHER PUBLICATIONS

Bayer, "Prefix B-Trees", IP.COM Journal, IP.COM Inc., West Henrietta, NY, Mar. 30, 2007, 29 pages.
Bhattacharjee et al., "Efficient Index Compression in DB2 LUW", IBM Research Report, Jun. 23, 2009, http://domino.research.ibm.com/library/cyberdig.nsf/papers/40B2C45876D0D747852575E100620CE7/$File/rc24815.pdf, 13 pages.
Oracle, "Oracle9i: Database Concepts", Jul. 2001, http://docs.oracle.com/cd/A91202_01/901_doc/server.901/a88856.pdf, 49 pages.
International Search Report and Written Opinion dated Jun. 8, 2015, received in International Patent Application No. PCT/US2015/018252, which corresponds to U.S. Appl. No. 14/339,072, 9 pages (Busch).
International Search Report and Written Opinion dated Jun. 2, 2015, received in International Patent Application No. PCT/US2015/018255, which corresponds to U.S. Appl. No. 14/336,967, 14 pages (Chander).
Ashkenazi et al., "Platform independent overall security architecture in multi-processor system-on-chip integrated circuits for use in mobile phones and handheld devices, " ScienceDirect, Computers and Electrical Engineering 33 (2007), 18 pages.
Invitation to Pay Additional Fees dated Feb. 13, 2015, received in International Patent Application No. PCT/US2014/063949, which corresponds to U.S. Appl. No. 14/135,433, 6 pages (Delpapa).
International Search Report and Written Opinion dated Mar. 9, 2015, received in International Patent Application No. PCT/US2014/059747, which corresponds to U.S. Appl. No. 14/137,440, 9 pages (Fitzpatrick).
International Search Report and Written Opinion dated Jan. 21, 2015, received in International Application No. PCT/US2014/059748, which corresponds to U.S. Appl. No. 14/137,511, 13 pages (Dancho).
International Search Report and Written Opinion dated Feb. 18, 2015, received in International Application No. PCT/US2014/066921, which corresponds to U.S. Appl. No. 14/135,260, 13 pages (Fitzpatrick).
Lee et al., "A Semi-Preemptive Garbage Collector for Solid State Drives," Apr. 2011, IEEE, pgs. 12-21.
Office Action dated Feb. 17, 2015, received in Chinese Patent Application No. 201210334987,1, which corresponds to U.S. Appl. No. 12/082,207, 9 pages (Prins).
International Search Report and Written Opinion dated May 4, 2015 received in International Patent Application No. PCT/US2014/065987, which corresponds to U.S. Appl. No, 14/135,400, 12 pages (George).
International Search Report and Written Opinion dated Mar. 17. 2015, received in International Patent Application No. PCT/US2014/067467, which corresponds to U.S. Appl. No, 14/135,420, 13 pages (Lucas).
International Search Report and Written Opinion dated Apr. 20, 2015, received in International Patent Application No. PCT/US2014/063949, which corresponds to U.S. Appl. No. 14/135,433, 21 pages (Delpapa).
International Search Report and Written Opinion dated Jun. 30, 2015, received in International Patent Application No. PCT/US2015/023927, which corresponds to U.S. Appl. No. 14/454,687, 11 pages (Kadayam).
International Search Report and Written Opinion dated Jul. 23, 2015, received in International Patent Application No. PCT/US2015/030850, which corresponds to U.S. Appl. No. 14/298,843, 12 pages (Ellis).

\* cited by examiner

|  | 718 | 720a | 720b | 720c | 730a | 730b | 730c |
|---|---|---|---|---|---|---|---|
| 712 { | -500 mV | 0 | 0 | B | 0 | 0 | B |
|  | -450 mV | 0 | 0 | B | 0 | 0 | B |
|  | -400 mV | 0 | 0 | B | 0 | 0 | B |
|  | -350 mV | 0 | 0 | B | 0 | 0 | B |
|  | -300 mV | 0 | 0 | B | 0 | 0 | B |
|  | -250 mV | 0 | 0 | B | 0 | 0 | B |
|  | -200 mV | 0 | 0 | B | 0 | 0 | B |
|  | -150 mV | 0 | 0 | B | 0 | 0 | B |
|  | -100 mV | 0 | 0 | B | 0 | 0 | B |
|  | -50 mV | 0 | 0 | B | 0 | 0 | B |
| 714 | 0 mV | 0 | 0 | B | 0 | 0 | B |
| 716 { | +50 mV | 0 | 0 | B | 0 | 0 | B |
|  | +100 mV | 0 | 1 | A | 0 | 1 | A |
|  | +150 mV | 0 | 1 | A | 0 | 1 | A |
|  | +200 mV | 0 | 1 | A | 0 | 1 | A |
|  | +250 mV | 1 | 1 | Er | 0 | 1 | A |
|  | +300 mV | 1 | 1 | Er | 0 | 1 | A |
|  | +350 mV | 1 | 1 | Er | 0 | 1 | A |
|  | +400 mV | 1 | 1 | Er | 0 | 1 | A |
|  | +450 mV | 1 | 1 | Er | 0 | 1 | A |
|  | +500 mV | 1 | 1 | Er | 0 | 1 | A |

Actual Results 720    Expected Results 730

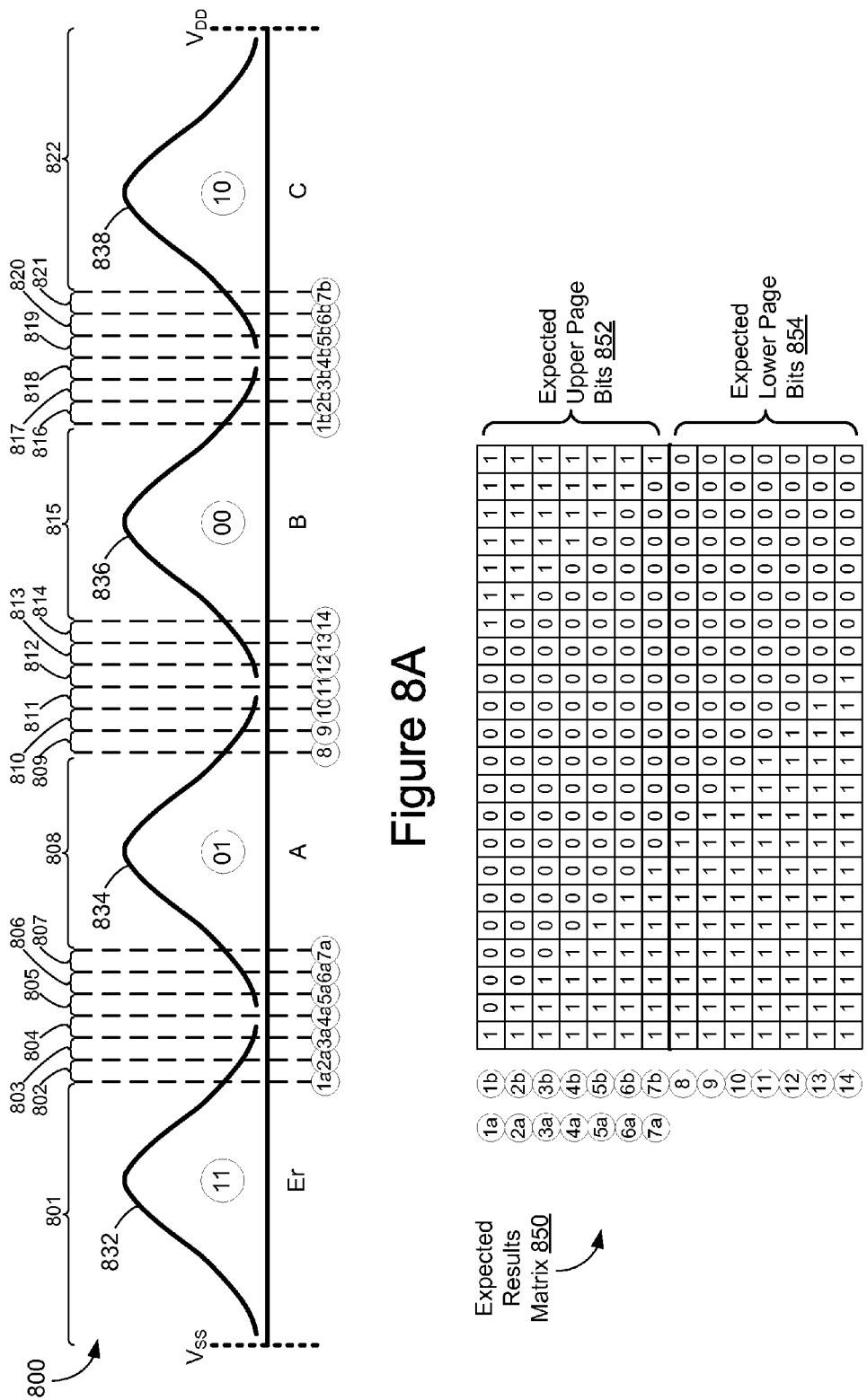

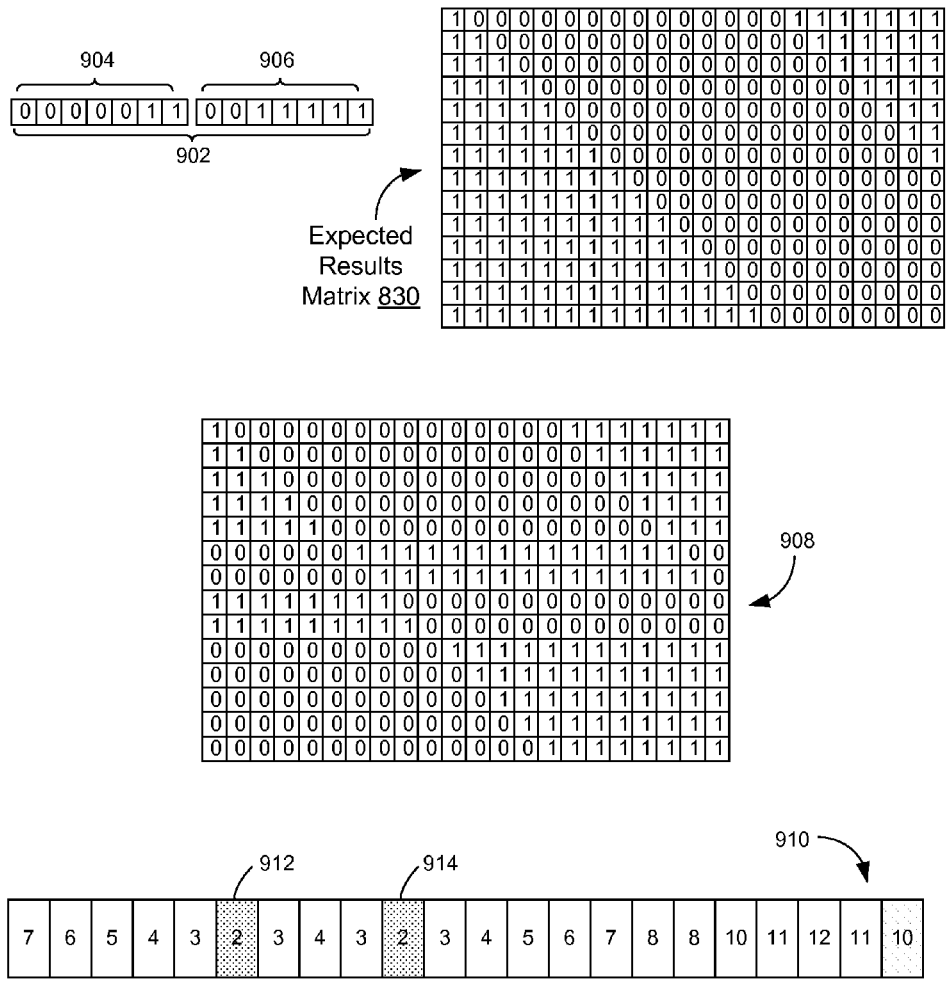
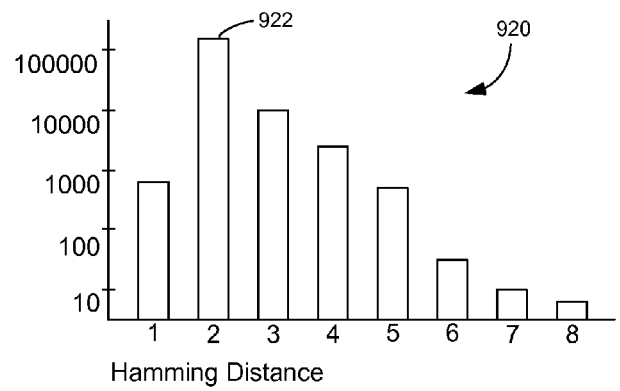
Figure 9A
Figure 9B

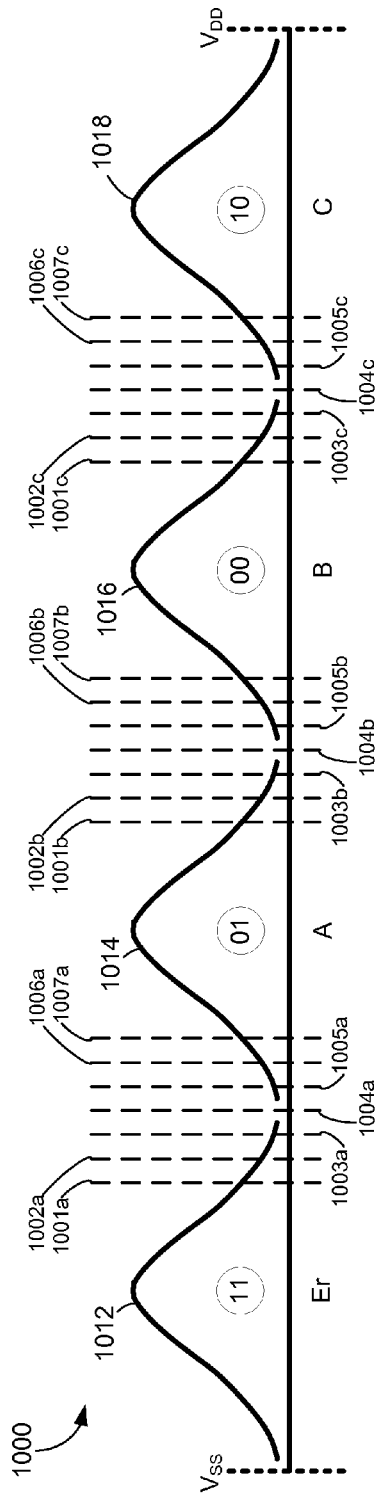

DEVICE AND METHOD FOR RESOLVING AN LM FLAG ISSUE

RELATED APPLICATIONS

This application claims priority to U.S. Provisional Application Ser. No. 61/833,888, filed Jun. 11, 2013, which is incorporated herein by reference in its entirety.

TECHNICAL FIELD

The disclosed embodiments relate generally to memory systems, and in particular, to improving the reliability with which data can be read from a storage medium, such as a flash memory.

BACKGROUND

Semiconductor memory devices, including flash memory, typically utilize memory cells to store data as an electrical value, such as an electrical charge or voltage. A flash memory cell, for example, includes a single transistor with a floating gate that is used to store a charge representative of a data value. Increases in storage density have been facilitated in various ways, including increasing the density of memory cells on a chip enabled by manufacturing developments, and transitioning from single-level flash memory cells to multi-level flash memory cells, so that two or more bits can be stored by each flash memory cell.

A drawback of increasing storage density is that the stored data is increasingly prone to being stored and/or read erroneously. In order to limit errors, a default reading threshold voltage for flash memory may be adjusted to compensate for deviations in the voltage distributions of the flash memory cell due to electrical fluctuations, defects in the memory cell, operating conditions and cell history. However, in some cases, successive adjustments to the default reading threshold voltage may lead to further errors.

SUMMARY

In some embodiments, a memory controller is configured to update an upper limit of a reading threshold voltage window for a respective portion of a storage medium so as to limit or reduce erroneous reads produced after adjusting one or more reading threshold voltage for the respective portion of the storage medium.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

FIG. 7B illustrates an exemplary set of results from a plurality of sensing operations performed on an MLC, in accordance with some embodiments.

FIG. 8A is a prophetic diagram of voltage distributions found in an MLC over time, in accordance with some embodiments.

FIG. 8B illustrates an exemplary expected results matrix, in accordance with some embodiments.

FIG. 9A illustrates exemplary matrix multiplication operations, in accordance with some embodiments.

FIG. 9B illustrates an exemplary histogram of hamming distances, in accordance with some embodiments.

FIG. 10A is a prophetic diagram of voltage distributions found in an MLC over time, in accordance with some embodiments.

FIGS. 10B-D illustrate respective results from the plurality of sensing operations performed on a respective portion of a storage medium, in accordance with some embodiments.

Figure 1:
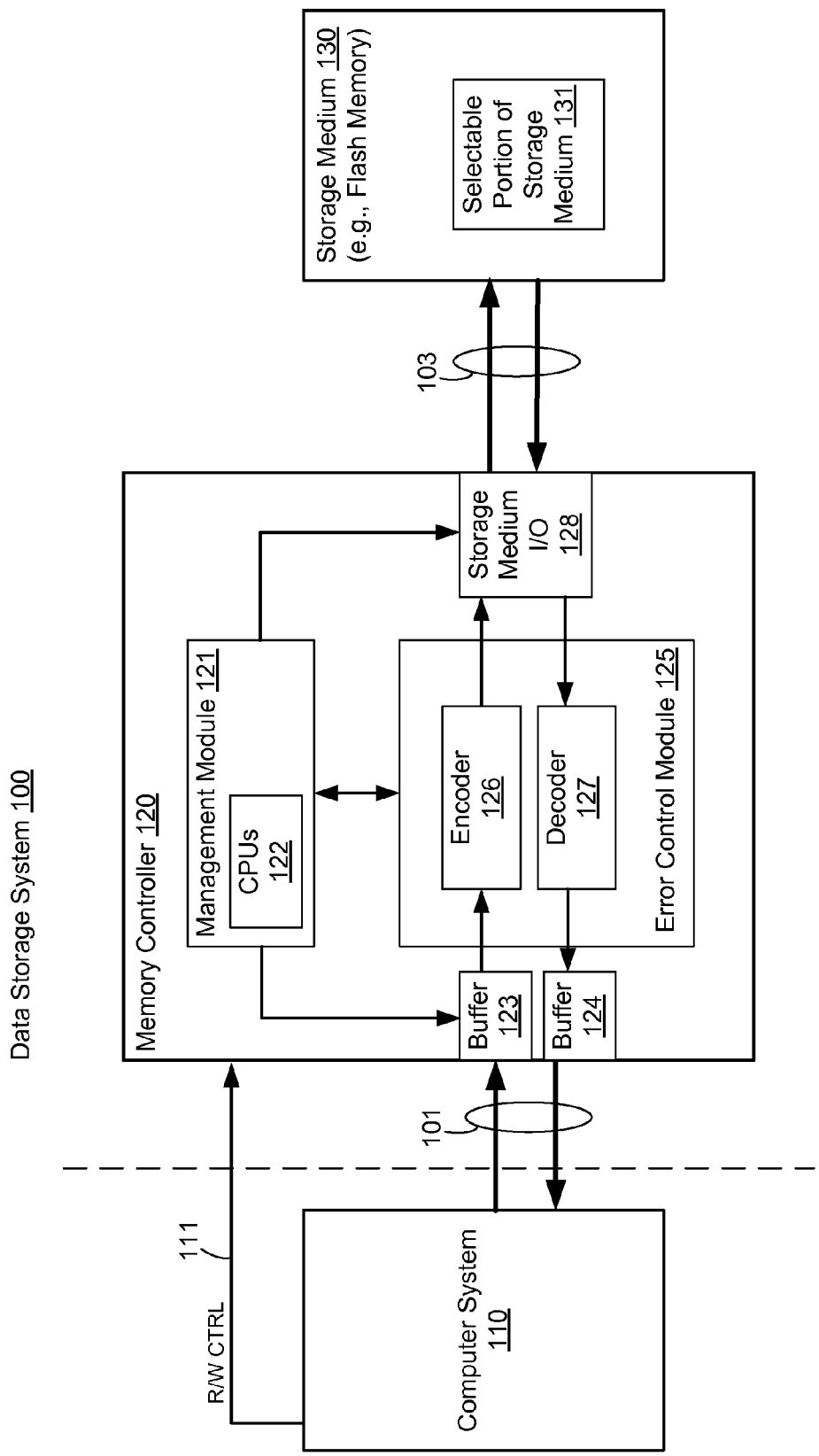
FIG. 1 is a block diagram illustrating an implementation of a data storage system, in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various implementations described herein include devices and/or methods that may improve the reliability with which data can be stored in and read from a storage medium, such as a flash memory. Some implementations include devices and/or methods to update an upper limit of a reading threshold voltage window for a respective portion of a storage medium.

In some embodiments, a memory controller is configured to perform a plurality of sensing operations for each memory cell in a respective portion of the storage medium, and obtain results from the plurality of sensing operations, where the plurality of sensing operations includes sensing operations using a predefined range of offsets from a previously established reading threshold voltage. The memory controller is further configured to determine an updated upper limit of the reading threshold voltage window based on the results from the plurality of sensing operations performed on the plurality of memory cells in the respective portion of the storage medium, and store the updated upper limit of the reading threshold voltage window for the respective portion of the storage medium.

In some embodiments, for each memory cell of the plurality of memory cells in the respective portion of the storage medium, the memory controller is configured to: compare the results from the plurality of sensing operations to expected results for the plurality of sensing operations; and determine a number of sensing operations in error.

In some embodiments, the comparing comprises performing a matrix multiplication operation of a 1×2M vector comprising the results from the plurality of sensing operations by a 2M×(3M+1) expected results matrix comprising the expected results for the plurality of sensing operations, where M is an integer number of sensing operations. In some embodiments, the comparing further comprises determining a hamming distance, for the respective memory cell, based on a result of the matrix multiplication operation.

In some embodiments, the matrix multiplication operation comprises an XOR and summation operation for each column of the expected results matrix. In some embodiments, determining the number of sensing operations in error comprises the hamming distance for the respective memory cell. In some embodiments, the memory controller is configured to: generate a histogram of the hamming distances determined for the plurality of memory cells in the respective portion of the storage medium; and determine the updated upper limit of the reading threshold voltage window in accordance with the generated histogram of hamming distances.

In some embodiments, for each memory cell of the plurality of memory cells in the respective portion of the storage medium, the memory controller is further configured to: determine a hamming distance based on the number of sensing operations in error; generate a histogram of the hamming distances determined for the plurality of memory cells in the respective portion of the storage medium; and determine the updated upper limit of the reading threshold voltage window in accordance with the generated histogram of hamming distances.

In some embodiments, the memory controller is configured to: determine a most frequent hamming distance based on the histogram; and determine an updated upper limit of the reading threshold voltage window in accordance with the most frequent hamming distance.

In some embodiments, the memory controller is configured to: generate a histogram based on the results from the plurality of sensing operations for each of the plurality of memory cells in the respective portion of the storage medium; determine a number of sensing operations in error based on the histogram; and determine the updated upper limit of the reading threshold voltage window in accordance with the number of sensing operations in error.

In some embodiments, the memory controller is further configured to: adjust one or more reading threshold voltages for the respective portion of the storage medium during read patrol operations; detect a predefined lower-middle (LM) flag issue after adjusting the one or more reading threshold voltages; and perform the plurality of sensing operations in response to detecting the LM flag issue.

In some embodiments, the read patrol operations are performed after a predefined number of program-erase (PE) cycles have been performed on the respective portion of the storage medium. In some embodiments, the read patrol operations are performed in accordance with a predefined schedule.

In some embodiments, the memory controller is further configured to: determine that a codeword cannot be decoded by the memory controller; detect a predefined LM flag issue after determining that the codeword cannot be decoded; and perform the plurality of sensing operations in response to detecting the LM flag issue.

In some embodiments, detecting the predefined LM flag issue comprises detecting the predefined LM flag issue in a last programmed word line in an open block of the respective portion of the storage medium.

In some embodiments, the upper limit of the reading threshold voltage window is stored in a memory of the memory controller.

In some embodiments, the reading threshold voltage window is a first reading threshold voltage window, and the memory controller is further configured to update an upper limit for one or more reading threshold voltage windows distinct from the first reading threshold voltage window.

Numerous details are described herein in order to provide a thorough understanding of the example implementations illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure more pertinent aspects of the implementations described herein.

FIG. 1 is a diagram of an implementation of a data storage system 100, in accordance with some embodiments. While some example features are illustrated, various other features have not been illustrated for the sake of brevity and so as not to obscure more pertinent aspects of the example implementations disclosed herein. To that end, as a non-limiting example, the data storage system 100 includes a memory controller 120, and a storage medium 130, and is used in conjunction with a computer system 110. In some implementations, storage medium 130 is a single flash memory device while in other implementations storage medium 130 includes a plurality of flash memory devices. In some implementations, storage medium 130 is NAND-type flash memory or NOR-type flash memory. Further, in some implementations memory controller 120 is a solid-state drive (SSD) controller. However, other types of storage media may be included in accordance with aspects of a wide variety of implementations.

Computer system 110 is coupled to memory controller 120 through data connections 101. However, in some implementations computer system 110 includes memory controller 120 as a component and/or a sub-system. Computer system 110 may be any suitable computer device, such as a computer, a laptop computer, a tablet device, a netbook, an internet kiosk, a personal digital assistant, a mobile phone, a smart phone, a gaming device, a computer server, or any other computing device. Computer system 110 is sometimes called a host or host system. In some implementations, computer system 110 includes one or more processors, one or more types of memory, a display and/or other user interface components such as a keyboard, a touch screen display, a mouse, a track-pad, a digital camera and/or any number of supplemental devices to add functionality.

Storage medium 130 is coupled to memory controller 120 through connections 103. Connections 103 are sometimes called data connections, but typically convey commands in addition to data, and optionally convey metadata, error correction information and/or other information in addition to data values to be stored in storage medium 130 and data values read from storage medium 130. In some implementations, however, memory controller 120 and storage medium 130 are included in the same device as components thereof. Storage medium 130 may include any number (i.e., one or more) of memory devices including, without limitation, non-volatile semiconductor memory devices, such as flash memory. For example, flash memory devices can be configured for enterprise storage suitable for applications such as cloud computing, or for caching data stored (or to be stored) in secondary storage, such as hard disk drives. Additionally and/or alternatively, flash memory can also be configured for relatively smaller-scale applications such as personal flash drives or hard-disk replacements for personal, laptop and tablet computers.

Storage medium 130 is divided into a number of addressable and individually selectable blocks, such as selectable portion 131. In some implementations, the individually selectable blocks are the minimum size erasable units in a flash memory device. In other words, each block contains the minimum number of memory cells that can be erased simultaneously. Each block is usually further divided into a plurality of pages and/or word lines, where each page or word line is typically an instance of the smallest individually accessible (readable) portion in a block. In some implementations (e.g., using some types of flash memory), the smallest individually accessible unit of a data set, however, is a sector, which is a subunit of a page. That is, a block includes a plurality of pages, each page contains a plurality of sectors, and each sector is the minimum unit of data for reading data from the flash memory device.

For example, one block comprises any number of pages, for example, 64 pages, 128 pages, 256 pages or another suitable number of pages. Blocks are typically grouped into a plurality of zones. Each block zone can be independently managed to some extent, which increases the degree of parallelism for parallel operations and simplifies management of storage medium 130.

As noted above, while data storage densities of non-volatile semiconductor memory devices are generally increasing, a drawback of increasing storage density is that the stored data is more prone to being stored and/or read erroneously. As described in greater detail below, error control coding can be utilized to limit the number of uncorrectable errors that are introduced by electrical fluctuations, defects in the storage medium, operating conditions, device history, write-read circuitry, etc., or a combination of these and various other factors.

In some implementations, memory controller 120 includes a management module 121, an input buffer 123, an output buffer 124, an error control module 125 and a storage medium interface (I/O) 128. Memory controller 120 may include various additional features that have not been illustrated for the sake of brevity and so as not to obscure more pertinent features of the example implementations disclosed herein, and that a different arrangement of features may be possible. Input and output buffers 123,124 provide an interface to computer system 110 through data connections 101. Similarly, storage medium I/O 128 provides an interface to storage medium 130 though connections 103. In some implementations, storage medium I/O 128 includes read and write circuitry, including circuitry capable of providing reading signals to storage medium 130 (e.g., reading threshold voltages for NAND-type flash memory).

In some implementations, management module 121 includes one or more processing units (CPUs, also sometimes called processors) 122 configured to execute instructions in one or more programs (e.g., in management module 121). In some implementations, the one or more CPUs 122 are shared by one or more components within, and in some cases, beyond the function of memory controller 120. Management module 121 is coupled to input buffer 123, output buffer 124 (connection not shown), error control module 125 and storage medium I/O 128 in order to coordinate the operation of these components.

Error control module 125 is coupled to storage medium I/O 128, input buffer 123 and output buffer 124. Error control module 125 is provided to limit the number of uncorrectable errors inadvertently introduced into data. In some embodiments, error control module 125 is executed in software by the one or more CPUs 122 of management module 121, and, in other embodiments, error control module 125 is implemented in whole or in part using special purpose circuitry to perform encoding and decoding functions. To that end, error control module 125 includes an encoder 126 and a decoder 127. Encoder 126 encodes data by applying an error control code to produce a codeword, which is subsequently stored in storage medium 130.

When the encoded data (e.g., one or more codewords) is read from storage medium 130, decoder 127 applies a decoding process to the encoded data to recover the data, and to correct errors in the recovered data within the error correcting capability of the error control code. Those skilled in the art will appreciate that various error control codes have different error detection and correction capacities, and that particular codes are selected for various applications for reasons beyond the scope of this disclosure. As such, an exhaustive review of the various types of error control codes is not provided herein. Moreover, those skilled in the art will appreciate that each type or family of error control codes may have encoding and decoding algorithms that are particular to the type or family of error control codes. On the other hand some algorithms, may be utilized at least to some extent in the decoding of a number of different types or families of error control codes. As such, for the sake of brevity, an exhaustive description of the various types of encoding and decoding algorithms generally available and known to those skilled in the art is not provided herein.

During a write operation, input buffer 123 receives data to be stored in storage medium 130 from computer system 110. The data held in input buffer 123 is made available to encoder 126, which encodes the data to produce one or more codewords. The one or more codewords are made available to storage medium I/O 128, which transfers the one or more codewords to storage medium 130 in a manner dependent on the type of storage medium being utilized.

A read operation is initiated when computer system (host) 110 sends one or more host read commands on control line 111 to memory controller 120 requesting data from storage medium 130. Memory controller 120 sends one or more read access commands to storage medium 130, via storage medium I/O 128, to obtain raw read data in accordance with memory locations (addresses) specified by the one or more host read commands. Storage medium I/O 128 provides the raw read data (e.g., comprising one or more codewords) to decoder 127. If the decoding is successful, the decoded data is provided to output buffer 124, where the decoded data is made available to computer system 110. In some implementations, if the decoding is not successful, memory controller 120 may resort to a number of remedial actions or provide an indication of an irresolvable error condition.

Flash memory devices utilize memory cells to store data as electrical values, such as electrical charges or voltages. Each flash memory cell typically includes a single transistor with a floating gate that is used to store a charge, which modifies the threshold voltage of the transistor (i.e., the voltage needed to turn the transistor on). The magnitude of the charge, and the corresponding threshold voltage the charge creates, is used to represent one or more data values. In some implementations, during a read operation, a reading threshold voltage is applied to the control gate of the transistor and the resulting sensed current or voltage is mapped to a data value.

The terms "cell voltage" and "memory cell voltage," in the context of flash memory cells, means the threshold voltage of the memory cell, which is the minimum voltage that needs to be applied to the gate of the memory cell's transistor in order for the transistor to conduct current. Similarly, reading threshold voltages (sometimes also called reading signals and reading voltages) applied to a flash memory cells are gate voltages applied to the gates of the flash memory cells to determine whether the memory cells conduct current at that gate voltage. In some implementations, when a flash memory cell's transistor conducts current at a given reading threshold voltage, indicating that the cell voltage is less than the reading threshold voltage, the raw data value for that read operation is a "1" and otherwise the raw data value is a "0."

Figure 2A:
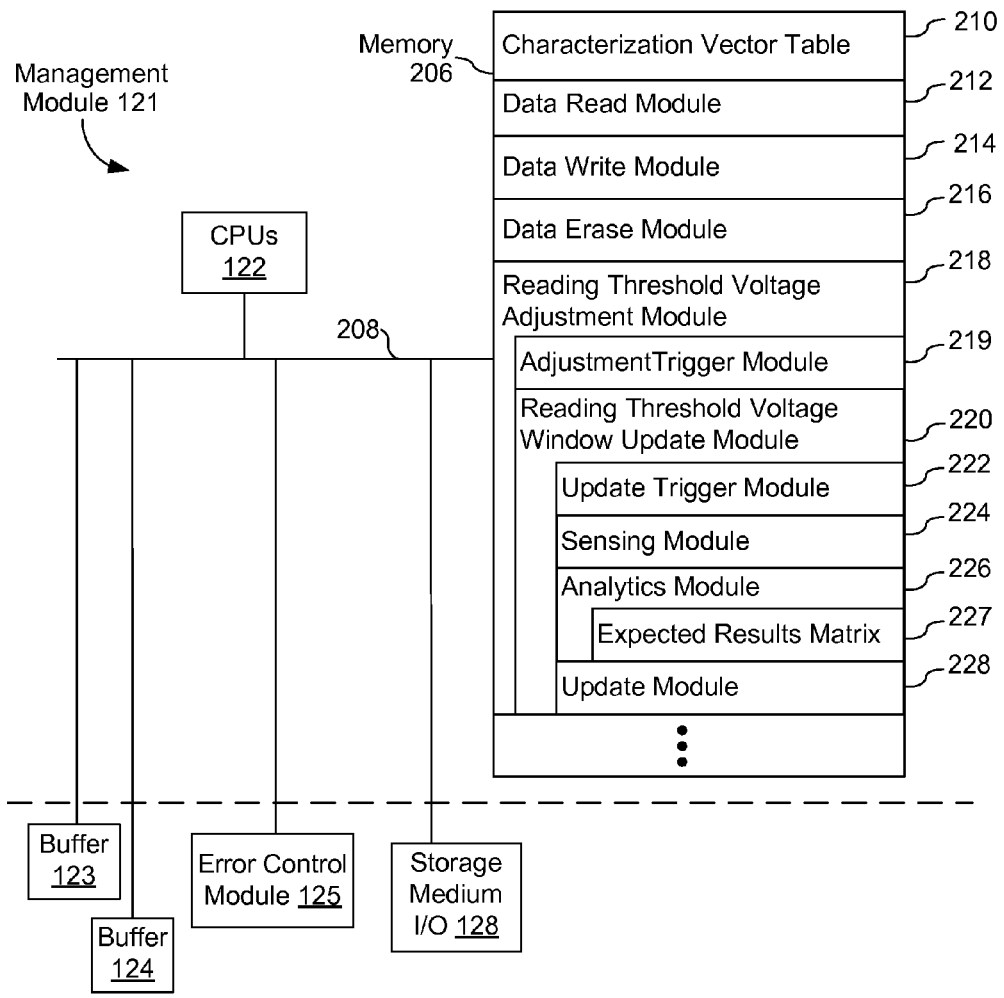
FIG. 2A is a block diagram illustrating an implementation of a management module, in accordance with some embodiments.

FIG. 2A is a block diagram illustrating an exemplary management module 121, in accordance with some embodiments. Management module 121 typically includes one or more processing units (CPUs) 122 for executing modules, programs and/or instructions stored in memory 206 and thereby performing processing operations, memory 206, and one or more communication buses 208 for interconnecting these components. Communication buses 208 optionally include circuitry (sometimes called a chipset) that interconnects and controls communications between system components. Management module 121 is coupled to buffer 123, buffer 124, error control module 125, and storage medium I/O 128 by communication buses 208. Memory 206 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 206 optionally includes one or more storage devices remotely located from the CPU(s) 122. Memory 206, or alternately the non-volatile memory device(s) within memory 206, comprises a non-transitory computer readable storage medium. In some embodiments, memory 206, or the computer readable storage medium of memory 206 stores the following programs, modules, and data structures, or a subset thereof:
- a characterization vector table 210 that includes a collection of characterization vectors 211 that store characterization data for respective portions of a storage medium;
- a data read module 212 that is used for reading data from the storage medium;
- a data write module 214 that is used for writing data to the storage medium;
- a data erase module 216 that is used for erasing data from the storage medium; and
- a reading threshold voltage adjustment module 218 for adjusting one or more reading threshold voltages for the respective portion of the storage medium.

In some embodiments, the reading threshold voltage adjustment module 218 includes an adjustment trigger module 219 for enabling the reading threshold voltage adjustment module 218 and a reading threshold voltage window update module 220 for updating an upper limit of a reading threshold voltage window for the respective portion of the storage medium with the following modules or sub-modules, or a subset thereof:
- an update trigger module 222 for enabling the reading threshold voltage window update module 220;
- a sensing module 224 for performing a plurality of sensing operations on each memory cell in the respective portion of the storage medium;
- an analytics module 226 (including an expected results matrix 227) for generating statistics from the results of the plurality of sensing operations performed on the memory cells in the respective portion of the storage medium and for determining an updated upper limit of the reading threshold voltage window for the respective portion of the storage medium; and
- an update module 228 for updating or storing in controller memory the updated upper limit of the reading threshold voltage window.

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 206 may store a subset of the modules and data structures identified above. Furthermore, memory 206 may store additional modules and data structures not described above. In some embodiments, the programs, modules, and data structures stored in memory 206, or the computer readable storage medium of memory 206, provide instructions for implementing any of the methods described below with reference to FIGS. 12A-B and 13A-C.

Although FIG. 2A shows a management module 121, FIG. 2A is intended more as functional description of the various features which may be present in a management module than as a structural schematic of the embodiments described herein. In practice, and as recognized by those of ordinary skill in the art, items shown separately could be combined and some items could be separated (e.g., the reading threshold voltage window update module 220 could be a component separate from management module 121).

Figure 2B:
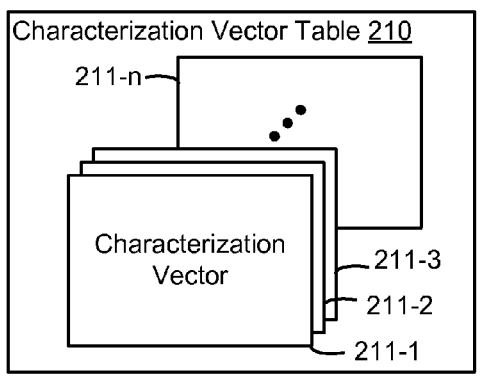
FIG. 2B is a diagram illustrating a characterization vector table included in FIG. 2A, in accordance with some embodiments.

FIG. 2B is a block diagram illustrating an implementation of a characterization vector table 210, in accordance with some embodiments. Characterization vector table 210 includes a collection of characterization vectors 211, that each store characterization data associated with a respective portion of a storage medium (e.g., a distinct die, block zone, block, word line, word line zone or page portion of storage medium 130). In some embodiments, each vector (e.g., vector 211-1, vector 211-2, . . . , vector 211-$n$) in the collection of characterization vectors 211 stores characterization data derived during each of at least two time periods (e.g., time T-1 and time T-2, or X program-erase (PE) cycles and 2X PE cycles). In some implementations, the characterization data stored in the characterization vectors 211 is statistically derived. For example, without limitation, in some embodiments in which a storage medium (e.g., storage medium 130 in FIG. 1) includes multiple die, characterization vector table 210 includes at least one characterization vector for each distinct die. In another example, in some embodiments, characterization vector table 210 includes a set of distinct characterization vectors 211 for each die in a storage medium (e.g., storage medium 130 in FIG. 1), and the set of distinct characterization vectors 211 for each die includes at least one distinct characterization vector for each block, or each block zone of a plurality of block zones, in the die. More detailed example implementations of characterization vectors 211 are described below with reference to FIG. 2C.

Figure 2C:
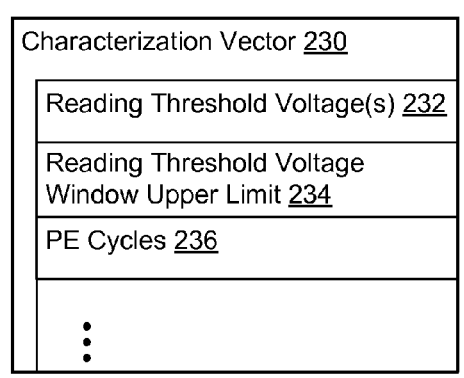
FIG. 2C is a diagram illustrating a characterization vector included in FIG. 2B, in accordance with some embodiments.

FIG. 2C is a schematic diagram of an implementation of a characterization vector 230 (e.g., corresponding to any one of characterization vectors 211 shown in FIG. 2B). In some implementations, characterization data stored in characterization vector 230 includes storage medium characterization parameter values such as a reading threshold voltage(s) field 232 (e.g., including one or more reading threshold voltages for the respective portion of the storage medium), a reading threshold voltages window upper limit field 234 (e.g., including an upper limit of the reading threshold voltage window for each of the one or more reading threshold voltages stored in field 232 for the respective portion of the storage medium), and a program-erase (PE) cycles field 236 (e.g., indicating a current count of the number of PE cycles of the respective portion of the storage medium). In some implementations, the one or more storage medium characterization parameter values provide an indication of at least one of: a physical characteristic associated with the respective portion of the storage medium (e.g., a distinct die, block zone, block, word line, word line zone or page portion of storage medium 130), a mode of operation associated with the respective portion of the storage medium, a history of use associated with the respective portion of the storage medium, a condition characteristic associated with the respective portion of the storage medium, a read type associated with the respective portion of the storage medium, and location(s) associated with the respective portion of the storage medium.

In some implementations, characterization vector 230 is a data structure that facilitates reading and decoding raw data values from storage medium 130. In some embodiments, management module 121 selects a characterization vector based on one or more storage medium characterization parameter values and prompts storage medium I/O 128 to read from a portion of the storage medium 130 (e.g., via one or more read access commands), such as selectable portion 131, in accordance with the selected characterization vector.

As discussed below with reference to FIG. 3A, a single-level flash memory cell (SLC) stores one bit ("0" or "1"). Thus, the storage density of a SLC memory device is one bit of information per memory cell. A multi-level flash memory cell (MLC), however, can store two or more bits of information per cell by using different ranges within the total voltage range of the memory cell to represent a multi-bit bit-tuple. In turn, the storage density of a MLC memory device is multiple-bits per cell (e.g., two bits per memory cell).

Figure 3A:
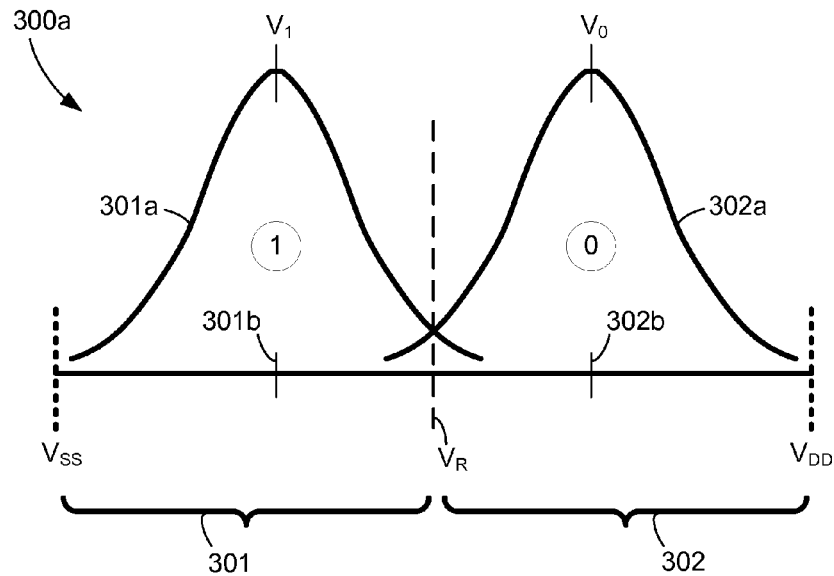
FIG. 3A is a prophetic diagram of voltage distributions found in a single-level flash memory cell (SLC) over time, in accordance with some embodiments.

FIG. 3A is a simplified, prophetic diagram of voltage distributions 400a found in a single-level flash memory cell (SLC), in accordance with some embodiments. The voltage distributions 300a shown in FIG. 3A have been simplified for illustrative purposes. In this example, the SLC's voltage range extends approximately from a voltage, $V_{SS}$, at a source terminal of an NMOS transistor to a voltage, $V_{DD}$, at a drain terminal of the NMOS transistor. As such, voltage distributions 300a extend between $V_{SS}$ and $V_{DD}$.

Sequential voltage ranges 301 and 302 between source voltage $V_{SS}$ and drain voltage $V_{DD}$ are used to represent corresponding bit values "1" and "0," respectively. Each voltage range 301, 302 has a respective center voltage $V_1$ 301b, $V_0$ 302b. As described above, in many circumstances the memory cell current sensed in response to an applied reading threshold voltages is indicative of a memory cell voltage different from the respective center voltage $V_1$ 301b or $V_0$ 302b corresponding to the respective bit value written into the memory cell. Errors in cell voltage, and/or the cell voltage sensed when reading the memory cell, can occur during write operations, read operations, or due to "drift" of the cell voltage between the time data is written to the memory cell and the time a read operation is performed to read the data stored in the memory cell. For ease of discussion, these effects are collectively described as "cell voltage drift." Each voltage range 301, 302 also has a respective voltage distribution 301a, 302a that may occur as a result of any number of a combination of error-inducing factors, examples of which are identified above.

In some implementations, a reading threshold voltage $V_R$ is applied between adjacent center voltages (e.g., applied proximate to the halfway region between adjacent center voltages $V_1$ 301b and $V_0$ 302b). Optionally, in some implementations, the reading threshold voltage is located between voltage ranges 301 and 302. In some implementations, reading threshold voltage $V_R$ is applied in the region proximate to where the voltage distributions 301a and 302a overlap, which is not necessarily proximate to the halfway region between adjacent center voltages $V_1$ 301b and $V_0$ 302b.

In order to increase storage density in flash memory, flash memory has developed from single-level (SLC) cell flash memory to multi-level cell (MLC) flash memory so that two or more bits can be stored by each memory cell. As discussed below with reference to FIG. 3B, an MLC flash memory device is used to store multiple bits by using voltage ranges within the total voltage range of the memory cell to represent different bit-tuples. An MLC flash memory device is typically more error-prone than a SLC flash memory device created using the same manufacturing process because the effective voltage difference between the voltages used to store different data values is smaller for an MLC flash memory device. Moreover, due to any number of a combination of factors, such as electrical fluctuations, defects in the storage medium, operating conditions, device history, and/or write-read circuitry, a typical error includes a stored voltage level in a particular MLC being in a voltage range that is adjacent to the voltage range that would otherwise be representative of the correct storage of a particular bit-tuple. As discussed in greater detail below, the impact of such errors can be reduced by gray-coding the data, such that adjacent voltage ranges represent single-bit changes between bit-tuples.

Figure 3B:
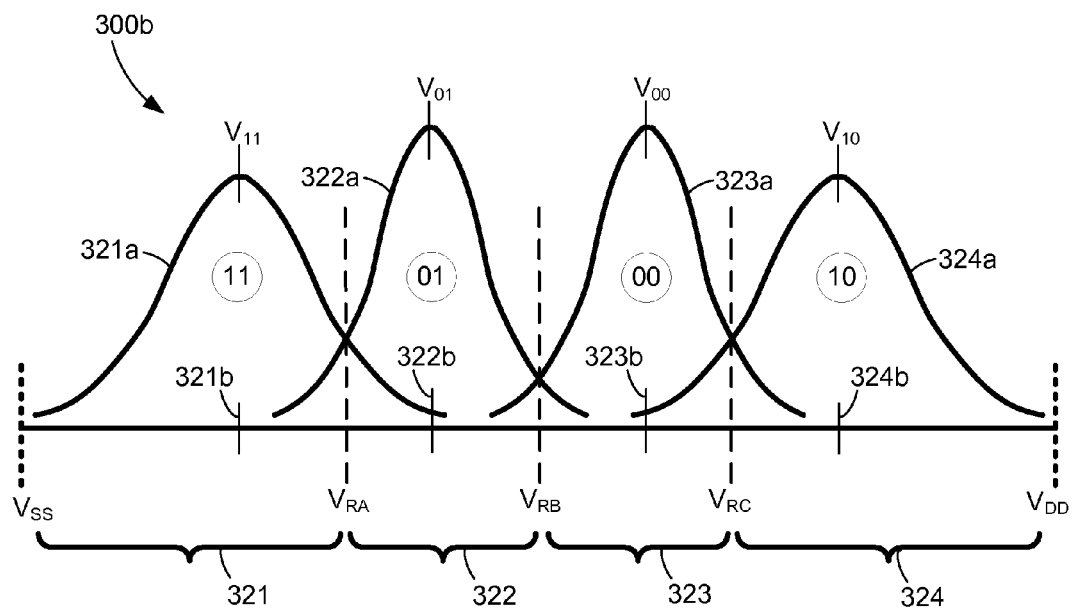
FIG. 3B is a prophetic diagram of voltage distributions found in a multi-level flash memory cell (MLC) over time, in accordance with some embodiments.

FIG. 3B is a simplified, prophetic diagram of voltage distributions 300b found in a multi-level flash memory cell (MLC) over time, in accordance with some embodiments. The voltage distributions 300b shown in FIG. 3B have been simplified for illustrative purposes. The cell voltage of an MLC approximately extends from a voltage, $V_{SS}$, at the source terminal of a NMOS transistor to a voltage, $V_{DD}$, at the drain terminal. As such, voltage distributions 300b extend between $V_{SS}$ and $V_{DD}$.

Sequential voltage ranges 321, 322, 323, 324 between the source voltage $V_{SS}$ and drain voltages $V_{DD}$ are used to represent corresponding bit-tuples "11," "01," "00," "10," respectively. Each voltage range 321, 322, 323, 324 has a respective center voltage 321b, 322b, 323b, 324b. Each voltage range 321, 322, 323, 324 also has a respective voltage distribution 321a, 322a, 323a, 324a that may occur as a result of any number of a combination of factors, such as electrical fluctuations, defects in the storage medium, operating conditions, device history (e.g., a number of PE cycles), and/or imperfect performance or design of write-read circuitry.

Ideally, during a write operation, the charge on the floating gate of the MLC would be set such that the resultant cell voltage is at the center of one of the ranges 321, 322, 323, 324 in order to write the corresponding bit-tuple to the MLC. Specifically, the resultant cell voltage would be set to one of $V_{11}$ 321b, $V_{01}$ 322b, $V_{00}$ 323b and $V_{10}$ 324b in order to write a corresponding one of the bit-tuples "11," "01," "00" and "10." In reality, due to the factors mentioned above, the initial cell voltage may differ from the center voltage for the data written to the MLC.

Reading threshold voltages $V_{RA}$, $V_{RB}$ and $V_{RC}$ are positioned between adjacent center voltages (e.g., positioned at or near the halfway point between adjacent center voltages) and, thus, define threshold voltages between the voltage ranges 321, 322, 323, 324. During a read operation, one of the reading threshold voltages $V_{RA}$, $V_{RB}$ and $V_{RC}$ is applied to determine the cell voltage using a comparison process. However, due to the various factors discussed above, the actual cell voltage, and/or the cell voltage received when reading the MLC, may be different from the respective center voltage $V_{11}$ 321b, $V_{01}$ 322b, $V_{00}$ 323b or $V_{10}$ 324b corresponding to the data value written into the cell. For example, the actual cell voltage may be in an altogether different voltage range, which strongly indicates that the MLC is storing a different bit-tuple than was written to the MLC. More commonly, the actual cell voltage may be close to one of the read comparison voltages, making it difficult to determine with certainty which of two adjacent bit-tuples is stored by the MLC.

Errors in cell voltage, and/or the cell voltage received when reading the MLC, can occur during write operations, read operations, or due to "drift" of the cell voltage between the time data is written to the MLC and the time a read operation is performed to read the data stored in the MLC. For ease of discussion, sometimes errors in cell voltage, and/or the cell voltage received when reading the MLC, are collectively called "cell voltage drift."

One way to reduce the impact of a cell voltage drifting from one voltage range to an adjacent voltage range is to gray-code the bit-tuples. Gray-coding the bit-tuples includes constraining the assignment of bit-tuples such that a respective bit-tuple of a particular voltage range is different from a respective bit-tuple of an adjacent voltage range by only one bit. For example, as shown in FIG. 3B, the corresponding bit-tuples for adjacent ranges 321 and 322 are respectively "11" and "01," the corresponding bit-tuples for adjacent ranges 322 and 323 are respectively "01" and "00," and the corresponding bit-tuples for adjacent ranges 323 and 324 are respectively "00" and "10." Using gray-coding, if the cell voltage drifts close to a read comparison voltage level, the error is typically limited to a single bit within the 2-bit bit-tuple.

Figure 4:
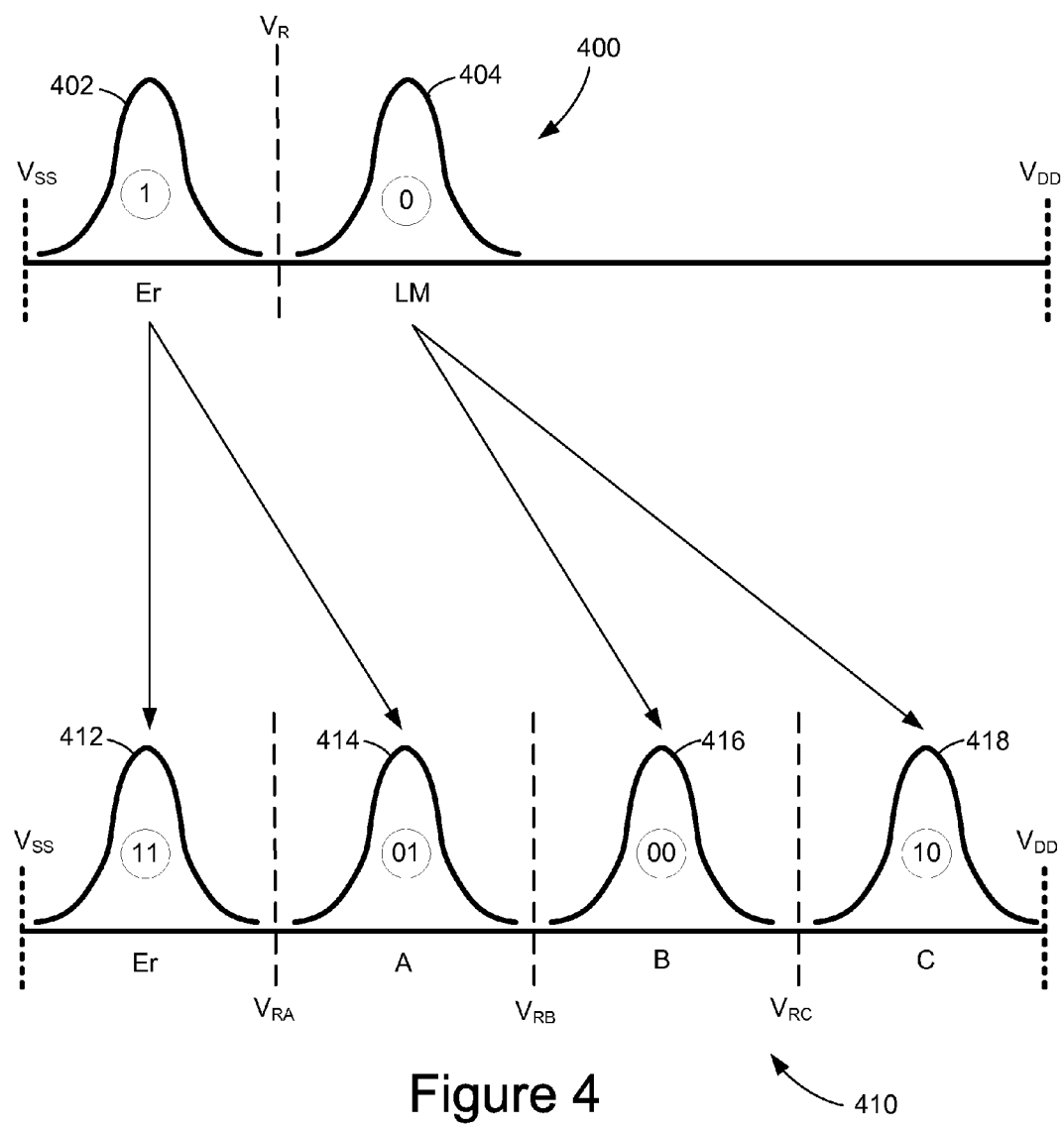
FIG. 4 illustrates two programming states of an MLC, in accordance with some embodiments.

FIG. 4 illustrates two distinct programming states of a 2-bit MLC. In some embodiments, for an un-programmed 2-bit MLC, the lower page bit is first programmed, and the upper page bit is subsequently programmed. Typically, a "fresh" MLC is programmed in this manner because it is easier to increase the charge on the floating gate than to draw charge away. FIG. 4 illustrates a first programming state 400, where the MLC stores a lower page bit. In the first programming state 400, the MLC has two voltage distributions 402, 404. Distribution 402 corresponds to an erase (Er) state, where the lower page bit has a value of "1." Distribution 404 corresponds to a lower-middle (LM) state where the lower page bit has a value of "0." During a read operation of an MLC in the first programming state, $V_R$ is applied to the MLC to determine the cell voltage using a comparison process.

In the second programming state 410, the MLC stores both lower and upper page bits. In the second programming state 410, the MLC has four voltage distributions 412, 414, 416, 418. Distribution 412 corresponds to an erase (Er) state where "1" was written to the lower page in the first programming state and "1" was written to the upper page in the second programming state. Distribution 414 corresponds to state A where "1" was written to the lower page in the first programming state and "0" is written to the upper page in the second programming state. Thus, states Er and A can only be programmed in the second programming state 410 when the MLC exhibited state Er in the first programming state 400. Distribution 416 corresponds to state B where "0" was written to the lower page in the first programming state and "0" is written to the upper page in the second programming state. Distribution 418 corresponds to state C where "0" was written to the lower page in the first programming state and "1" is written to the upper page in the second programming state. Thus, states B and C can only be programmed in the second programming state 410 when the MLC exhibited state LM in the first programming state 400. During a read operation of a memory cell in the second programming state, $V_{RA}$, $V_{RB}$ and $V_{RC}$ are applied successively (one at a time) to the MLC to determine the cell voltage using a comparison process. One skilled in the art will appreciate how the above description applies to q-bit MLC, where q≥3.

Figure 5:
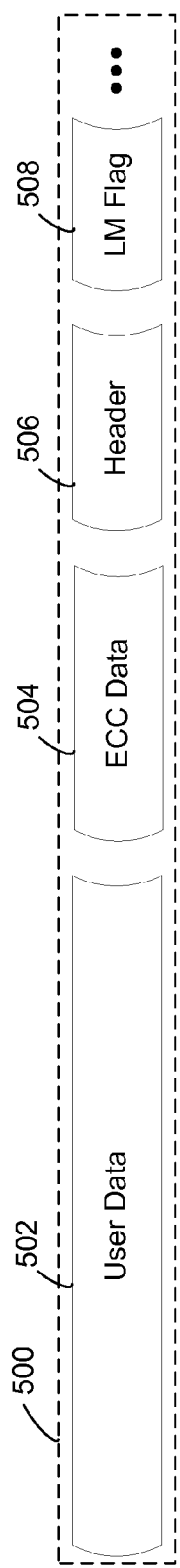
FIG. 5 illustrates a diagram of data stored in a word line of a storage medium, in accordance with some embodiments.

FIG. 5 illustrates data 500 stored in a word line of the storage medium. Data 500 at least includes user data 502, ECC data 504, header information 506 and an LM flag 508. In some embodiments, LM flag 508 stores 16 bits of data that indicates whether the memory cells in the word line are in a first or second programming state. In some embodiments, the 16 bits of data corresponding to the LM flag are stored in single level flash memory cells (SLC). If LM flag 508 is FF FF (11111111 11111111), then the memory cells are in the first programming state, where the upper page bits of the memory cells have not been written. If LM flag 508 is 55 55 (01010101 01010101) or AA AA (10101010 10101010), then the memory cells are in the second programming state, where the upper page bits of the memory cells have been written. In some embodiments, to prevent interference between adjacent word lines LM flags 508 for adjacent word lines are written as 55 55 or AA AA in alternating order. In some implementations, a memory controller local to storage medium 130 uses the LM flag 508 as a validity indicator to determine whether upper page data is valid for the respective word line. In some embodiments, when an LM flag issue occurs, LM flag 508 erroneously indicates that memory cells are in the second programming state (or in the first programming state) when in actuality the opposite is true.

Figure 6:
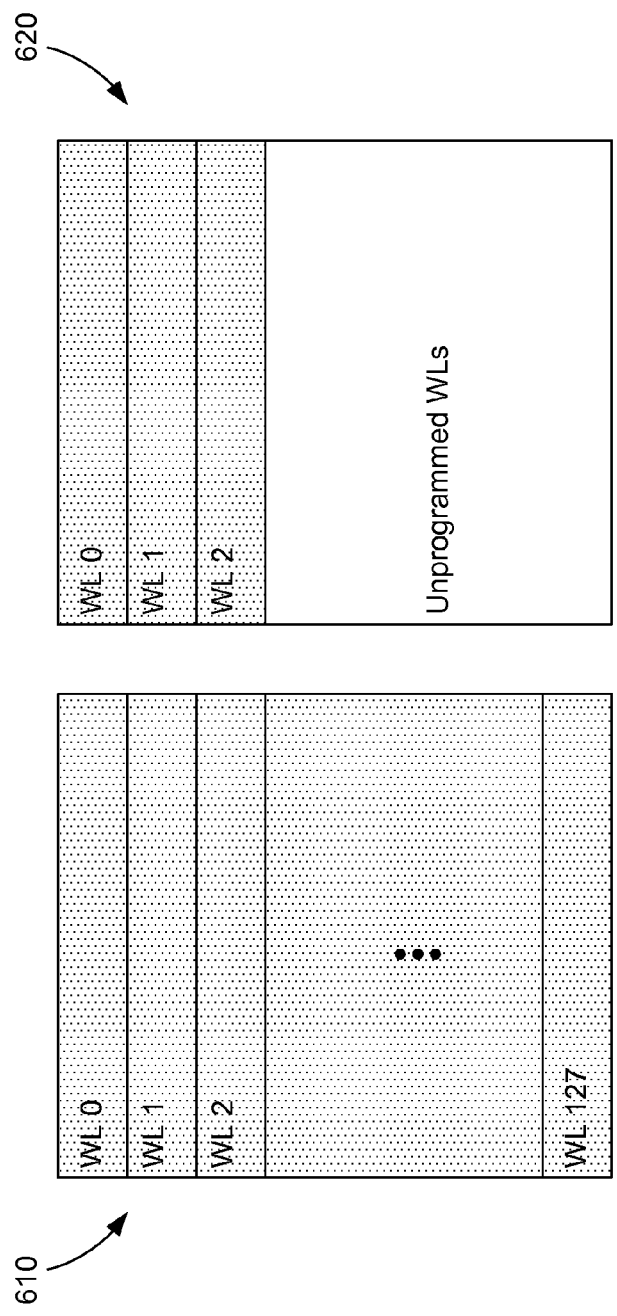
FIG. 6 illustrates two programming states of a block of memory, in accordance with some embodiments.

FIG. 6 illustrates two different programming states for a block of memory. In some implementations, a memory die includes a plurality of blocks of memory and a respective block of memory includes 128 word lines and a respective word line includes 141312 memory cells. Block 610 corresponds to a closed block of memory where the upper and lower pages of all 128 word lines have been programmed. Block 620 corresponds to an open block of memory where only the first three word lines (e.g., WL 0, WL 1, WL 2) have been programmed. In some embodiments, the memory controller is configured to disable the LM flag for all word lines in a closed block of memory (e.g., block 610). As a result, the memory controller ceases to check for an LM flag issue (defined below with respect to read errors detected after reading threshold voltage adjustment) for word lines within the closed block. In some embodiments, the memory controller is configured to check for an LM flag issue for all word lines of an open block (e.g., the memory controller checks for an LM flag issue in WL 0, WL 1, WL 2 of open block 620). In some other embodiments, the memory controller is configured to check for an LM flag issue in only the last programmed word line of an open block (e.g., the memory controller only checks for an LM flag issue in WL 2 of open block 620).

Figure 7A:
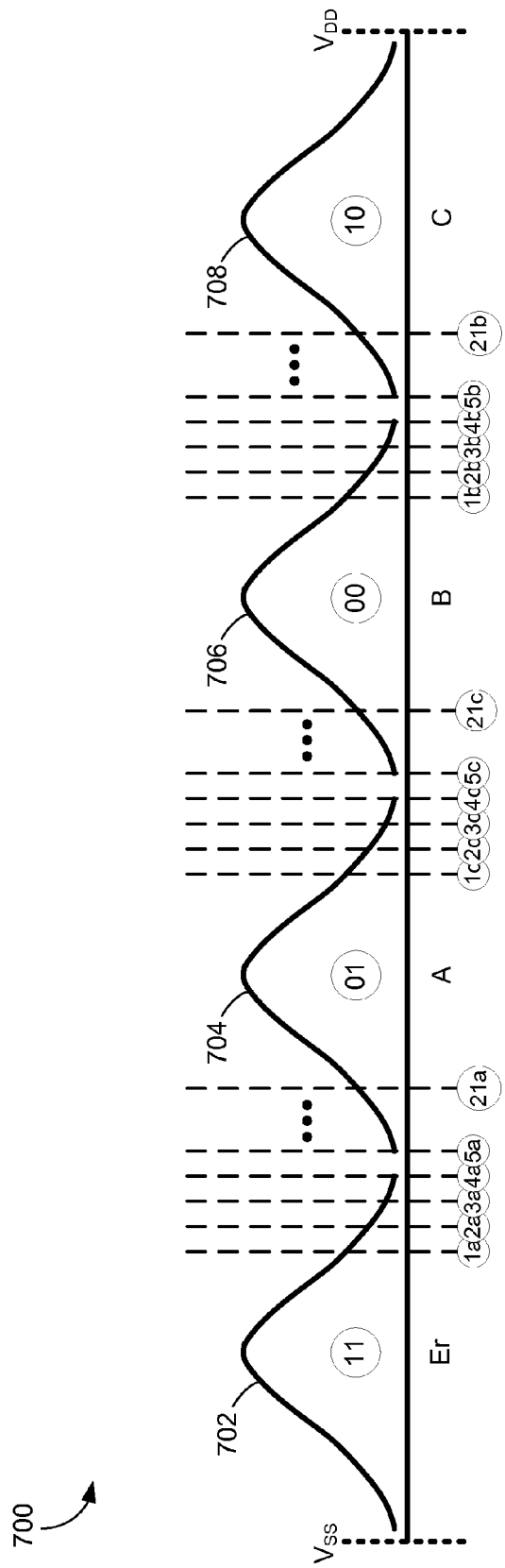
FIG. 7A is a prophetic diagram of voltage distributions found in an MLC over time, in accordance with some embodiments.

FIG. 7A shows a prophetic diagram of voltage distributions 700 found in a 2-bit MLC over time. Voltage ranges 702, 704, 706, 708 correspond to erase (Er), A, B, and C states, respectively. FIG. 7A, for example, shows a respective number of read operations, denoted as M, performed on the MLC (e.g., M=21). In this example, the twenty-one read operations (sometimes herein also called "sensing operations") include twenty-one sensing points (e.g., sensing points 1a, 2a, 3a, 4a, 5a, . . . , 21a) between voltages ranges 702 and 704 to read an upper page bit of the MLC, twenty-one sensing points (e.g., sensing points 1c, 2c, 3c, 4c, 5c, . . . , 21c) in the region between voltage ranges 704 and 706 to read a lower page bit of the MLC, and twenty-one sensing points (e.g., sensing points 1b, 2b, 3b, 4b, 5b, . . . , 21b) between voltages ranges 706 and 708 to read the upper page bit of the MLC. For example, a respective read operation of the 2-bit MLC requires one sensing point relative to $V_{RA}$, one sensing point relative to $V_{RB}$, and one sensing point relative to $V_{RC}$. Voltage distributions 700 are split into a number of zones by a respective number of read operations (or sensing operations). For example, in FIG. 7A, the sixty-three sensing points divide voltage distributions 700 into 3M+1 zones (or 64 zones).

When performing the plurality of sensing operations on a respective MLC, the memory controller performs the sensing operations using a predefined range of offsets from a previously established (or current) reading threshold voltage (e.g., $V_{RA}$, $V_{RB}$ or $V_{RC}$). The memory controller is configured to access the previously established reading threshold voltage (e.g., $V_{RA}$, $V_{RB}$ or $V_{RC}$) for a respective portion of the storage medium including the respective MLC. The previously established reading threshold voltage for the respective portion of the storage medium is stored as characterization parameter value in a characterization vector 211 corresponding to the respective portion of the storage medium. The voltages for the plurality of sensing operations are offsets from the previously established reading threshold voltage (e.g., $V_{RA}$, $V_{RB}$ and $V_{RC}$). The memory controller performs a predetermined number of sensing operations relative to $V_{RA}$, $V_{RB}$ and $V_{RC}$ over a predefined range of voltages in accordance with a predefined step.

Table 710 in FIG. 7B illustrates actual results 720 and expected results 730 from the plurality of sensing operations performed on a respective MLC. In FIG. 7B, column 718 shows the voltages of the plurality of sensing operations as offsets from the previously established reading threshold voltage. The sensing operations include a first subset of sensing operations 712 with a negative offset from the previously established threshold reading voltage, a sensing operation 714 at the previously established reading threshold voltage, and a second subset of sensing operations 716 with a positive offset from the previously established threshold reading voltage.

In FIG. 7B, for example, twenty-one sensing operations are performed on the MLC with ten sensing operations having a negative offset from $V_{RA}$, $V_{RB}$ and $V_{RC}$, one sensing operation at $V_{RA}$, $V_{RB}$ and $V_{RC}$ and ten sensing operations having a positive offset from $V_{RA}$, $V_{RB}$ and $V_{RC}$. Each of the sensing operations are performed in a predefined range (e.g., +/−500 mV from $V_{RA}$, $V_{RB}$ and $V_{RC}$) according to a predefined step (e.g., 50 mV). The actual results 720 from the plurality of sensing operations include: column 720a showing the upper page bits read from the MLC at each offset voltage; column 720b showing the lower pages bits read from the MLC at each offset voltage; and column 720c showing the state read from the MLC at each offset voltage. The expected results 730 from the plurality of sensing operations include: column 730a showing the upper page bits expected to be read at each offset voltage; column 730b showing the lower page bits expected to be read at each offset voltage; and column 730c showing the expected state to be read at each offset voltage. A number of sensing operations 740 are in error because the read states and expected states do not match.

FIGS. 8A-B and 9A-B illustrate a methodology for generating a hamming distance histogram from results of a plurality of sensing operations performed on memory cells in a respective portion of the storage medium and determining an updated upper limit of the reading threshold voltage window for the respective portion of the storage medium based on the generated hamming distance histogram.

FIG. 8A shows a prophetic diagram of voltage distributions 800 found in a 2-bit MLC over time. The voltage distributions 800 are split into a number of zones by a respective number of read operations (or sensing operations). Voltage ranges 832, 834, 836, 838 correspond to erase (Er), A, B, and C states, respectively. FIG. 8A, for example, shows a respective number of read operations, denoted as M, performed on the MLC (e.g., M=7). The seven read operations include seven sensing points (e.g., sensing points 1a, 2a, 3a, 4a, 5a, 6a, 7a) between voltages ranges 832 and 834 to read an upper page bit of the MLC, seven sensing points (e.g., sensing points 8-14) in the region between voltage ranges 834 and 836 to read a lower page bit of the MLC, and seven sensing points (e.g., sensing points 1b, 2b, 3b, 4b, 5b, 6b, 7b) between voltages ranges 836 and 838 to read the upper page bit of the MLC. These 21 sensing points divide voltage distributions 800 into 22 zones (e.g., zones 801-822).

FIG. 8B illustrates expected results matrix 850 produced for the respective number of read operations. Expected results matrix 850 is generated based on the respective number of read operations (e.g., M=7) and the amount of bits stored by the MLC (e.g., 2-bit MLC). For 2-bit MLC, expected results matrix 850 includes a number of rows equal to 2M and a number of columns equal to 3M+1 or the number of zones. Thus, the dimensions of expected results matrix 850 are 2M× (3M+1). The columns of expected results matrix 850 correspond to zones 801-822 of voltage distributions 800, and the rows of expected results matrix 850 correspond to the sensing points of the upper page bit values 1a and 1b, 2a and 2b, 3a and 3b, 4a and 4b, 5a and 5b, 6a and 6b, 7a and 7b and the sensing points of the lower pages bit values 8, 9, 10, 11, 12, 13, 14. One skilled in the art will appreciate how to apply the above description to expand the expected results matrix for a greater or lesser number of read operations and for q-bit MLC, where q≥3.

The expected upper page bit values 852 in the first M rows of the expected results matrix 850 correspond to the upper page bit value expected to be read in each zone with the corresponding sensing points. With reference to the first row, for example, sensing point 1a is expected to produce an upper page bit value of "1" in only zone 801 and sensing point 1b is expected produce an upper page bit value of "1" in zones 816-822.

The expected lower page bit values 854 in the last M rows of the expected results matrix 850 correspond to the lower page bit value expected to be read in each zone with the corresponding sensing points. With reference to the last row, for example, sensing point 14 is expected to produce a lower page bit value of "1" in zones 801-814.

FIG. 9A illustrates performing matrix multiplication operations on the results from the plurality of sensing operations and the expected results from the plurality of sensing operations. A number of sensing operations, M, performed on a 2-bit MLC produce 2M bits. In FIG. 9A, for example, the bits read from the MLC for seven read (or sensing) operations (e.g., M=7) is results vector 902. The seven most significant bits 904 of results vector 902 are the upper page bits read from the MLC for each of the seven sensing operations, and the seven least significant bits 906 of results vector 902 are the lower page bits read from the MLC for each of the seven sensing operations.

Results vector 902 is mathematically combined with the expected results matrix 850 (e.g., discussed above with reference to FIGS. 8A-B). First, results vector 902 is combined with each of the columns of expected results matrix 850 via M parallel bitwise XOR operations. Matrix 908 illustrates the results from the bitwise XOR operations. Second, the number of "1s" in each of the columns of matrix 908 are arithmetically summed. Vector 910 (e.g., a 1×(3M+1) vector) shows the results from the summation operations. Vector 910 includes a hamming distance for all columns of matrix 908 (or zones of the voltages distributions 800). Third, the minimum hamming distance (e.g., hamming distance 912 or 914 with a value of 2) in vector 910 is selected as the hamming distance (or the minimum hamming distance) for the MLC.

FIG. 9B illustrates an exemplary prophetic histogram 920 of hamming distances for a respective portion of the storage medium. The above description of FIG. 9A describes generating a hamming distance for a respective memory cell in the respective portion of the storage medium; however, the process is repeated for all memory cells in the respective portion of the storage medium. The hamming distances generated for all memory cells in the respective portion of the storage medium are sorted into the hamming distance histogram where the bins on the x-axis indicate a hamming distance value and the y-axis (or height of each bar) indicates the number of memory cells in the respective portion of the storage medium with the hamming distance value. In some embodiments, when building the hamming distance histogram, cells with a minimum hamming distance of zero are excluded from the hamming distance histogram. After generating the complete hamming distance histogram, an optimum hamming distance is determined. In some embodiments, the optimum hamming distance is the most frequent minimum hamming distance (e.g., a hamming distance of 2 in histogram 920). In some other embodiments, the optimum hamming distance is a hamming distance that reduces the amount of invalid bit mappings below a predetermined threshold amount (e.g., 15%, 20%, 25%, etc.).

The memory controller determines an updated upper limit of the reading threshold voltage window for the respective portion of the storage medium based on the optimum hamming distance. For example, if the optimum hamming distance is 2 and the step value of the sensing operations was 50 mV, then the updated upper limit of the reading threshold voltage window for the respective portion of the storage medium is 100 mV less than the previous upper limit of the reading threshold voltage window. The memory controller then stores (or overwrites) the updated upper limit of the reading threshold voltage window for the respective portion of the storage medium in a memory of (or associated with) the memory controller. For example, the upper limit of the reading threshold voltage window for the respective portion of the storage medium is stored as a characterization parameter value (e.g., in field 234) in a characterization vector 211 corresponding to the respective portion of the storage medium.

FIGS. 10A-D and 11A-C illustrate a simplified methodology (i.e., without matrix multiplication operations) for determining an updated upper limit of the reading threshold voltage window for a respective portion of the storage medium based on results of a plurality of sensing operations performed on memory cells in the respective portion of the storage medium.

FIG. 10A shows a prophetic diagram of voltage distributions 1000 found in a 2-bit MLC over time. Voltage ranges 1012, 1014, 1016, 1018 correspond to erase (Er), A, B, and C states, respectively. FIG. 10A, for example, shows a respective number of read operations (or sensing operations), denoted as M, performed on the MLC (e.g., M=7). The seven read operations include seven sensing points (e.g., sensing points 1001a, 1002a, 1003a, 1004a, 1005a, 1006a, 1007a) between voltages ranges 1012 and 1014 (e.g., relative to $V_{RA}$) to read an upper page bit of the MLC, seven sensing points (e.g., sensing points 1001b, 1002b, 1003b, 1004b, 1005b, 1006b, 1007b) in the region between voltage ranges 1014 and 1016 (e.g., relative to $V_{RB}$) to read a lower page bit of the MLC, and seven sensing points (e.g., sensing points 1001c, 1002c, 1003c, 1004c, 1005c, 1006c, 1007c) between voltages ranges 1016 and 1018 (e.g., relative to $V_{RC}$) to read the upper page bit of the MLC.

In FIG. 10B, the results from the plurality of sensing operations performed on the respective portion of the storage medium (e.g., a word line) in the region between voltage ranges 1012 and 1014 are shown in AR results table 1010. AR results table 1010 includes an upper page bit read at each of the sensing points for all memory cells in the respective portion of the storage medium. In some embodiments, the AR results are the upper page bits given the fact that the lower page bit is a "1." For example, the first row in AR results table 1010 shows the upper page bit value read from the first memory cell (e.g., cell 1) in the respective word line at each of the seven sensing points 1001a, 1002a, 1003a, 1004a, 1005a, 1006a, 1007a. The "X" symbol denotes bits that eventually will be ignored when calculating the cumulative distribution function (CDF) for the AR window, explained in more detail below.

In FIG. 10C, the results from the plurality of sensing operations performed on the respective portion of the storage medium (e.g., a word line) in the region between voltage ranges 1014 and 1016 are shown in BR results table 1020. BR results table 1020 includes a lower page bit read at each of the sensing points for all memory cells in the respective portion of the storage medium. For example, the first row in BR results table 1020 shows the upper page bit value read from the first memory cell (e.g., cell 1) in the respective word line at each of the seven sensing points 1001b, 1002b, 1003b, 1004b, 1005b, 1006b, 1007b.

In FIG. 10D, the results from the plurality of sensing operations performed on the respective portion of the storage medium (e.g., a word line) in the region between voltage ranges 1016 and 1018 are shown in CR results table 1030. CR results table 1030 includes the upper page bit read at each of the sensing points for all memory cells in the respective portion of the storage medium. In some embodiments, the AR results are the upper page bits given the fact that the lower page bit is a "0." For example, the first row in CR results table 1030 shows the upper page bit value read from the first memory cell (e.g., cell 1) in the respective word line at each of the seven sensing points 1001c, 1002c, 1003c, 1004c, 1005c, 1006c, 1007c. The "X" symbol denotes bits that eventually will be ignored when calculating the cumulative distribution function (CDF) for the CR window, explained in more detail below.

A cumulative distribution function (CDF) for the BR window (the region between voltage ranges 1014 and 1016) is calculated based on BR results table 1020. A CDF component (e.g., CDF[1001*b*]) for sensing point 1001*b* is determined by summing the number of "1s" in the first column of BR results table 1020. The remaining CDF components (e.g., CDF[1002*b*], CDF[1003*b*], etc.) for sensing points 1002*b*, 1003*b*, 1004*b*, 1005*b*, 1006*b*, 1007*b* are determined in a manner similar to CDF[1001*b*].

For the upper page sensing points in the AR window (the region between voltage ranges 1012 and 1014) and the CR window (the region between voltage ranges 1016 and 1018), the results from successive sensing points are matched into respective vectors. For example, a first respective vector UP[1001] is a paring of the results from the first column of the AR results table 1010 corresponding to sensing point 1001*a* and the results from the first column of the CR results table 1030 corresponding to sensing point 1001*c*. For the lower page sensing points, for example, LP[1001] includes the results from the first column of the BR results table 1020 corresponding to sensing point 1001*b*.

A cumulative distribution function (CDF) for the AR window is calculated by the bitwise function UP[m] AND LP[m'], where m corresponds to a respective sensing point and m' is associated with a corresponding BR sensing point. In some embodiments, m' is fixed as the default sensing point. For example, a CDF component CDF[1001*a*] is determined by summing the number of "1s" resulting from the bitwise function UP[1001] AND LP[1001]. The remaining CDF components (e.g., CDF[1002*a*], CDF[1003*a*], etc.) for sensing points 1002*a*, 1003*a*, 1004*a*, 1005*a*, 1006*a*, 1007*b* are determined in a manner similar to CDF[1001*a*].

A cumulative distribution function (CDF) for the CR window is calculated by the bitwise function NOT (UP[m] OR LP[m']), where m corresponds to a respective sensing point and m' is associated with a corresponding BR sensing point. In some embodiments, m' is fixed as the default sensing point. For example, a CDF component CDF[1001*c*] is determined by summing the number of "1s" resulting from the bitwise function NOT (UP[1001] OR LP[1001]). The remaining CDF components (e.g., CDF[1002*c*], CDF[1003*c*], etc.) for sensing points 1002*c*, 1003*c*, 1004*c*, 1005*c*, 1006*c*, 1007*c* are determined in a manner similar to CDF[1001*c*].

Figure 11A:
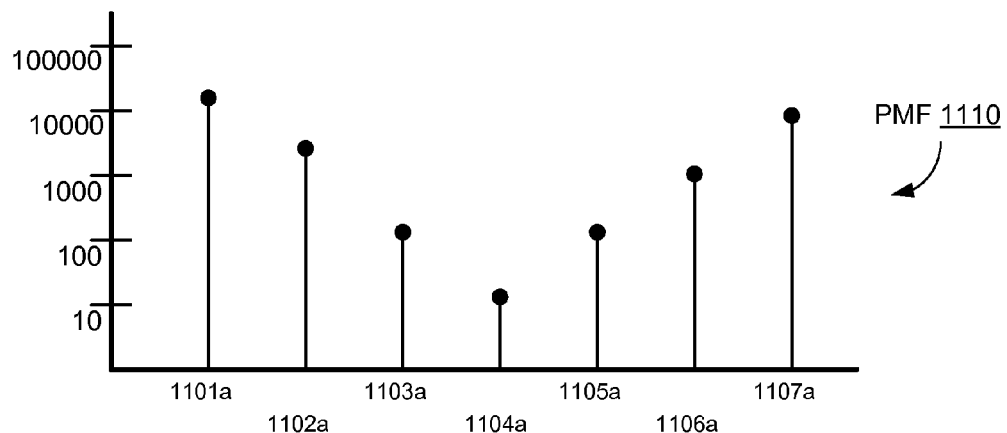
FIGS. 11A-11C illustrate exemplary probability mass functions for respective reading threshold voltage windows, in accordance with some embodiments.

FIG. 11A illustrates a probability mass function (PMF) 1110 (sometimes also called a histogram) corresponding to the above calculated CDF for the AR window. PMF 1110 is determined from differences between successive components in the CDF corresponding to the AR window. For example, point 1101*a*, corresponding to sensing point 1001*a*, is determined from the difference of CDF[1001*a*] and CDF[1002*a*]. PMF 1110 illustrates the number of memory cells in the respective portion of the storage medium with a respective sensing point as its reading threshold voltage. Typically, the PMF for a respective window is convex in shape. If the PMF for the respective window is convex, then the upper limit of the reading threshold voltage window does not need to be updated. In FIG. 11A, for example, PMF 1110 is convex; thus, the upper limit of the reading threshold voltage window corresponding to $V_{RA}$ for the respective portion of the storage medium does not need to be updated.

Figure 11B:
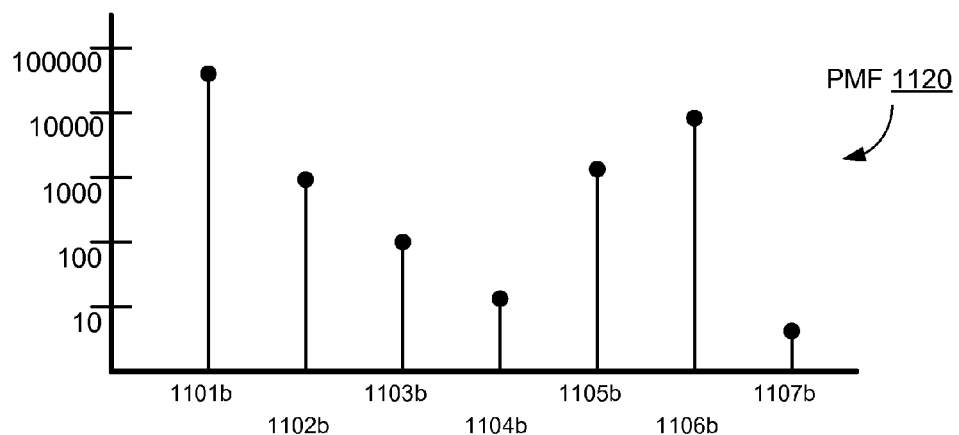

FIG. 11B illustrates probability mass function (PMF) 1120 corresponding to the above calculated CDF for the BR window. PMF 1120 is determined from differences between successive components in the CDF corresponding to the BR window. For example, point 1101*b*, corresponding to sensing point 1001*b*, is determined from the difference of CDF[1001*b*] and CDF[1002*b*]. In FIG. 11B, for example, PMF 1120 is not convex; thus, the upper limit of the reading threshold voltage window corresponding to $V_{RB}$ for the respective portion of the storage medium needs to be updated. In FIG. 11B, PMF 1120 losses its convexity around point 1107*b*.

The memory controller is configured to reduce the upper limit of the reading threshold voltage window corresponding to $V_{RB}$ for the respective portion of the storage medium so that the updated upper limit of the reading threshold voltage window is associated with point 1106*b* (e.g., the upper limit is reduced to the voltage corresponding to point 1106*b*). The memory controller then stores (or overwrites) the updated upper limit of the reading threshold voltage window for the respective portion of the storage medium in a memory of (or associated with) the memory controller. For example, the upper limit of the reading threshold voltage window for the respective portion of the storage medium is stored as a characterization parameter value (e.g., in field 234) in a characterization vector 211 corresponding to the respective portion of the storage medium.

Figure 11C:
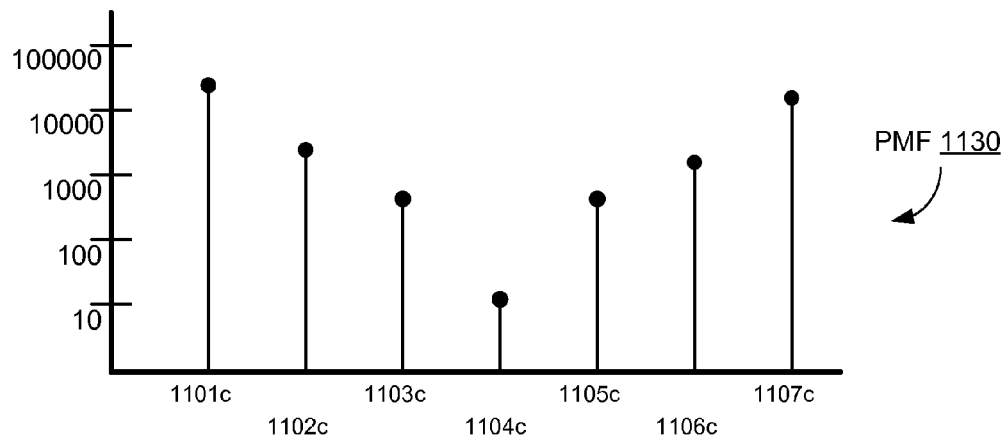

FIG. 11C illustrates probability mass function (PMF) 1130 corresponding to the above calculated CDF for the CR window. The PMF 1130 is determined from differences between successive components in the CDF corresponding to the CR window. For example, point 1101*c*, corresponding to sensing point 1001*c*, is determined from the difference of CDF[1001*c*] and CDF[1002*c*]. In FIG. 11C, for example, PMF 1130 is convex; thus, the upper limit of the reading threshold voltage window corresponding to $V_{RC}$ for the respective portion of the storage medium does not need to be updated.

Figure 12A:
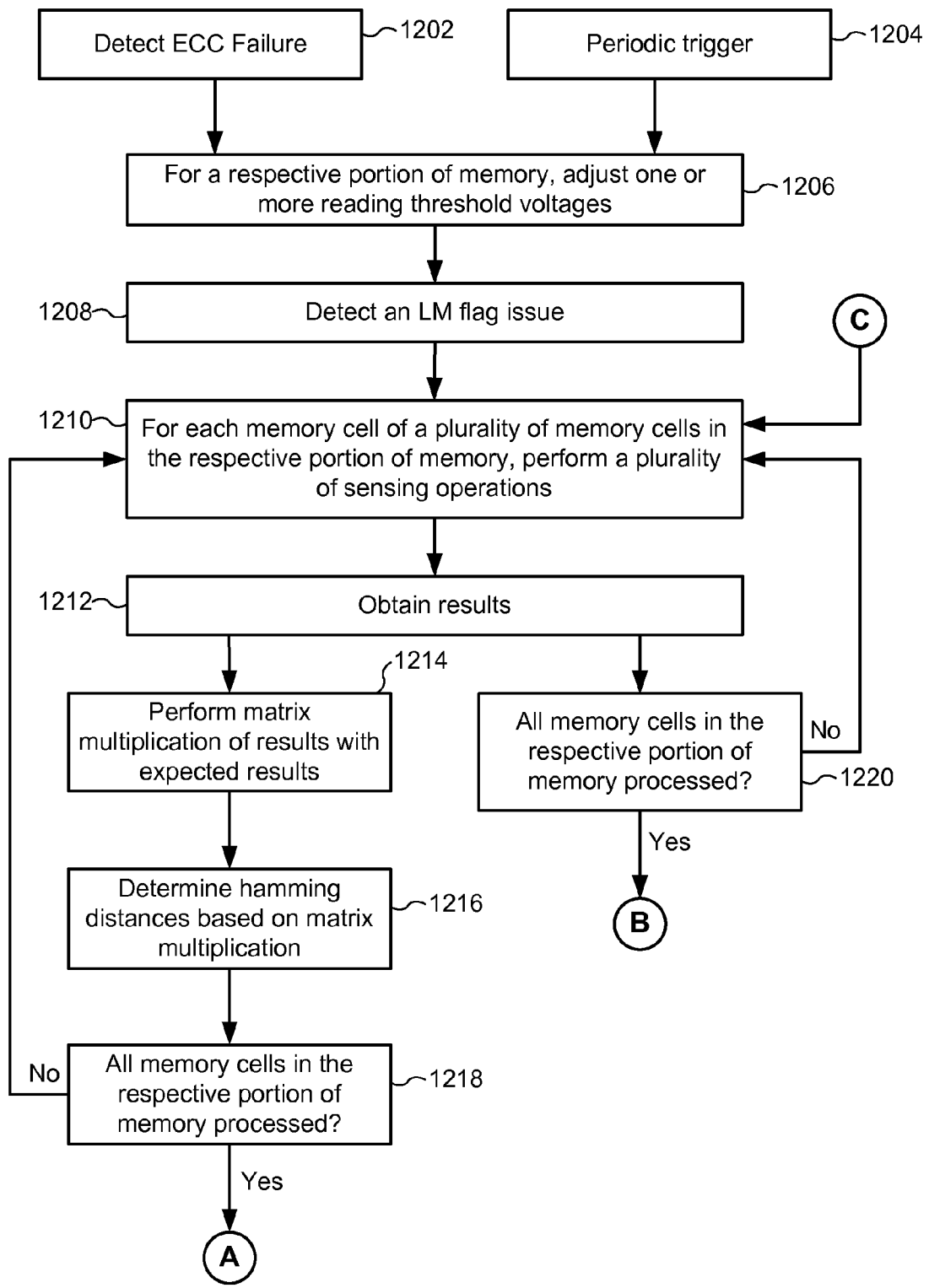
FIGS. 12A-B illustrate a flowchart representation of a method of updating an upper limit of a reading threshold voltage window for a respective portion of a storage medium, in accordance with some embodiments.
Figure 12B:
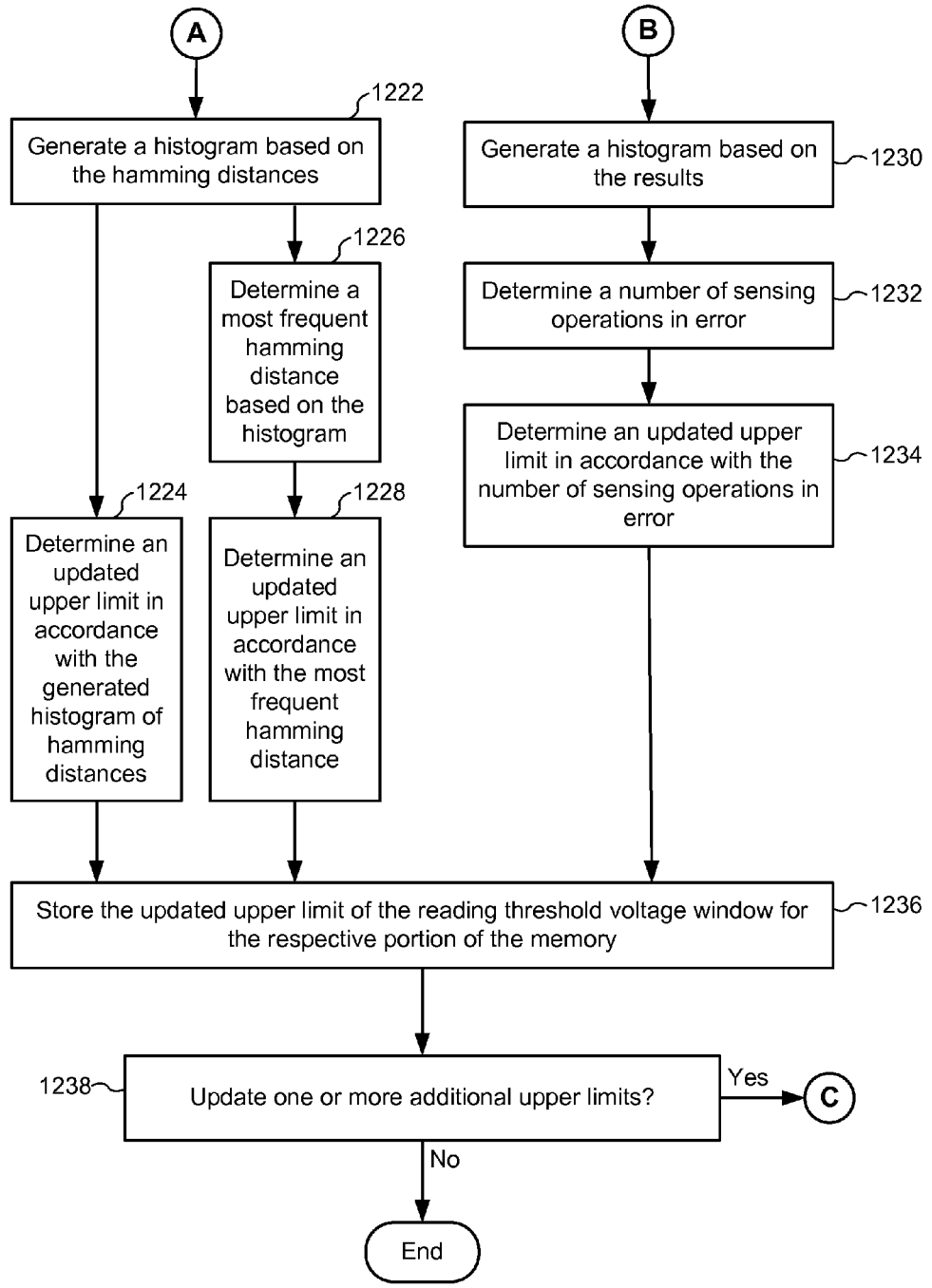

FIGS. 12A-B illustrate a flowchart representation of a method 1200 of updating an upper limit of a reading threshold voltage window for a respective portion of a storage medium (e.g., a distinct die, block zone, block, word line, word line zone or page portion of storage medium 130 in FIG. 1). In some embodiments, method 1200 is performed by a memory controller (e.g., memory controller 120 in FIG. 1) distinct from and coupled to the storage medium (e.g., storage medium 130 in FIG. 1) by one or more connections (e.g., connections 103 in FIG. 1).

At least in some implementations, method 1200 is performed by a memory controller (e.g., memory controller 120 in FIG. 1), or one or more components of the memory controller (e.g., management module 121 in FIGS. 1 and 2A), or one or more sub-components of the memory controller (e.g., reading threshold voltage window update module 220) or a combination thereof. In some embodiments, method 1200 is governed by instructions that are stored in a non-transitory computer readable storage medium and the instructions are executed by one or more processors of a device, such as the one or more processing units (CPUs) 122 of management module 121, shown in FIGS. 1 and 2A.

At block 1202, the memory controller detects (e.g., with adjustment trigger module 219) an ECC failure. For example, an ECC failure occurs when error control module 125 (or more specifically decoder 127) is unable to correctly decode a codeword read from a respective portion of the storage medium. In response to detecting the ECC failure, the memory controller, at block 1206, adjusts one or more reading threshold voltages for the respective portion of the storage medium (e.g., with reading threshold voltage adjustment module 218).

At block 1204, the memory controller detects (e.g., with adjustment trigger module 219) a periodic trigger (e.g., a set amount of PE cycles or a predefined schedule) associated with a respective portion of the storage medium. In response to detecting the periodic trigger, the memory controller, at block 1206, adjusts one or more reading threshold voltages for the respective portion of the storage medium (e.g., with reading threshold voltage adjustment module 218).

After adjusting the one or more reading threshold voltages for the respective portion of the storage medium, the memory controller, at block 1208, detects (e.g., with update trigger module 222) a predefined LM flag issue. For example, if a threshold number of read memory cells (e.g., 10%, 15% or 25%) indicate invalid bit mappings or the ECC failure persists after reading at least some of the respective portion of the storage medium with the one or more adjusted reading threshold voltages, then the predefined LM flag issue is detected.

In response to detecting the predefined LM flag issue, the memory controller, at block 1210, performs (e.g., with sensing module 224) a plurality of sensing operations on the memory cells in the respective portion of the storage medium. After performing the plurality of sensing operation, the memory controller, at block 1212, obtains results from the plurality of sensing operations performed on the memory cells in the respective portion of the storage medium.

In a first path, the memory controller, at block 1214, performs (e.g., with analytics module 226) a matrix multiplication operation for each memory cell in the respective portion of the storage medium whereby the results from the plurality of sensing operations performed on a respective memory cell are mathematically combined with expected results for the plurality of sensing operations (e.g., expected results matrix 227). At block 1216, the memory controller determines a hamming distance (sometimes called a minimum hamming distance) for each memory cell in the respective portion of the storage medium based on the results of the matrix multiplication operations. At block 1218, the memory controller determines whether all memory cells in the respective portion of the storage medium have been processed. If memory cells remain to be processed, then the process goes back to block 1210. If no more memory cells need to be processed, then the process proceeds to block 1222.

In a second path, at block 1220, the memory controller determines whether all memory cells in the respective portion of the storage medium have been processed. If memory cells remain to be processed, then the process goes back to block 1210. If no more memory cells need to be processed, then the process proceeds to block 1230.

In the first path, the memory controller, at block 1222, generates (e.g., with analytics module 226) a histogram based on the hamming distances determined for the memory cells in the respective portion of the storage medium. After generating the histogram, the memory controller, at block 1224, determines (e.g., with analytics module 226) an updated upper limit of the reading threshold voltage window for the respective portion of the storage medium based on the histogram. Or, after generating the histogram, the memory controller, at block 1226, determines (e.g., with analytics module 226) a most frequent hamming distance based on the histogram and, at block 1228, determines (e.g., with analytics module 226) an updated upper limit of the reading threshold voltage window for the respective portion of the storage medium based on the most frequent hamming distance.

In the second path, the memory controller, at block 1230, generates (e.g., with analytics module 226) a histogram based on the results obtained from the plurality of sensing operations performed on the memory cells in the respective portion of the storage medium. After generating the histogram, the memory controller, at block 1232, determines (e.g., with analytics module 226) a number of sensing operations in error and, at block 1234, determines (e.g., with analytics module 226) an updated upper limit of the reading threshold voltage window for the respective portion of the storage medium based on the number of sensing operations in error.

At block 1236, the memory controller stores (e.g., with update module 228) the updated upper limit of the reading threshold voltage window for the respective portion of the storage medium. For example, the updated upper limit of the reading threshold voltage window is stored as a characterization parameter value (e.g., in field 234) of a characterization vector 211 corresponding to the respective portion of the storage medium.

At block, 1238, the memory controller determines whether to update one or more additional upper limits of the reading threshold voltage windows for the respective portion of the storage medium. If the memory controller determines that additional upper limits are to be updated, then the process proceeds to block 1210 and repeats the process for the additional upper limits. If the memory controller determines that additional upper limits are not to be updated, then the process ends.

Figure 13A:
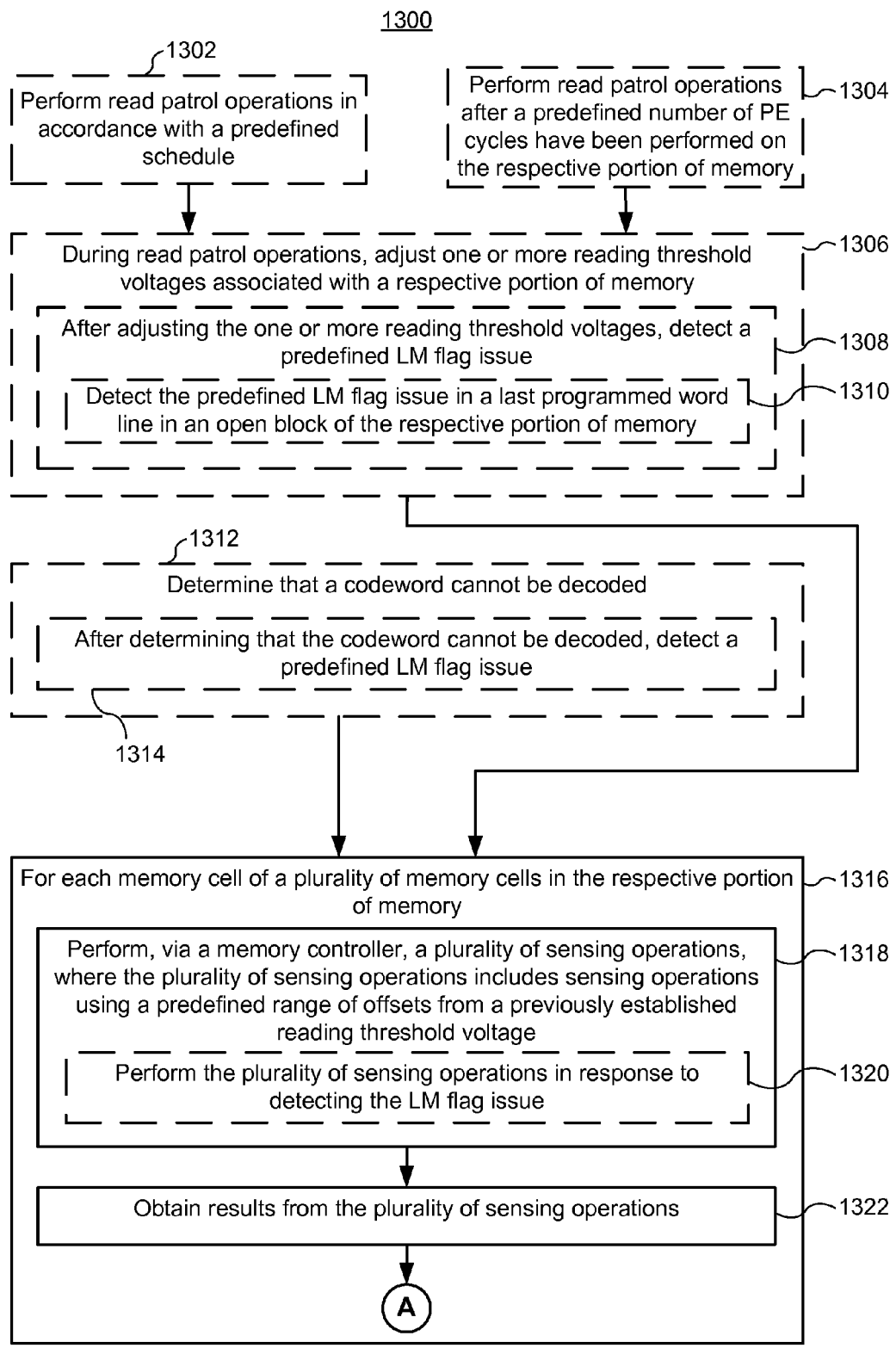
FIGS. 13A-C illustrate a flowchart representation of a method of updating an upper limit of a reading threshold voltage window for a respective portion of a storage medium, in accordance with some embodiments.
Figure 13B:
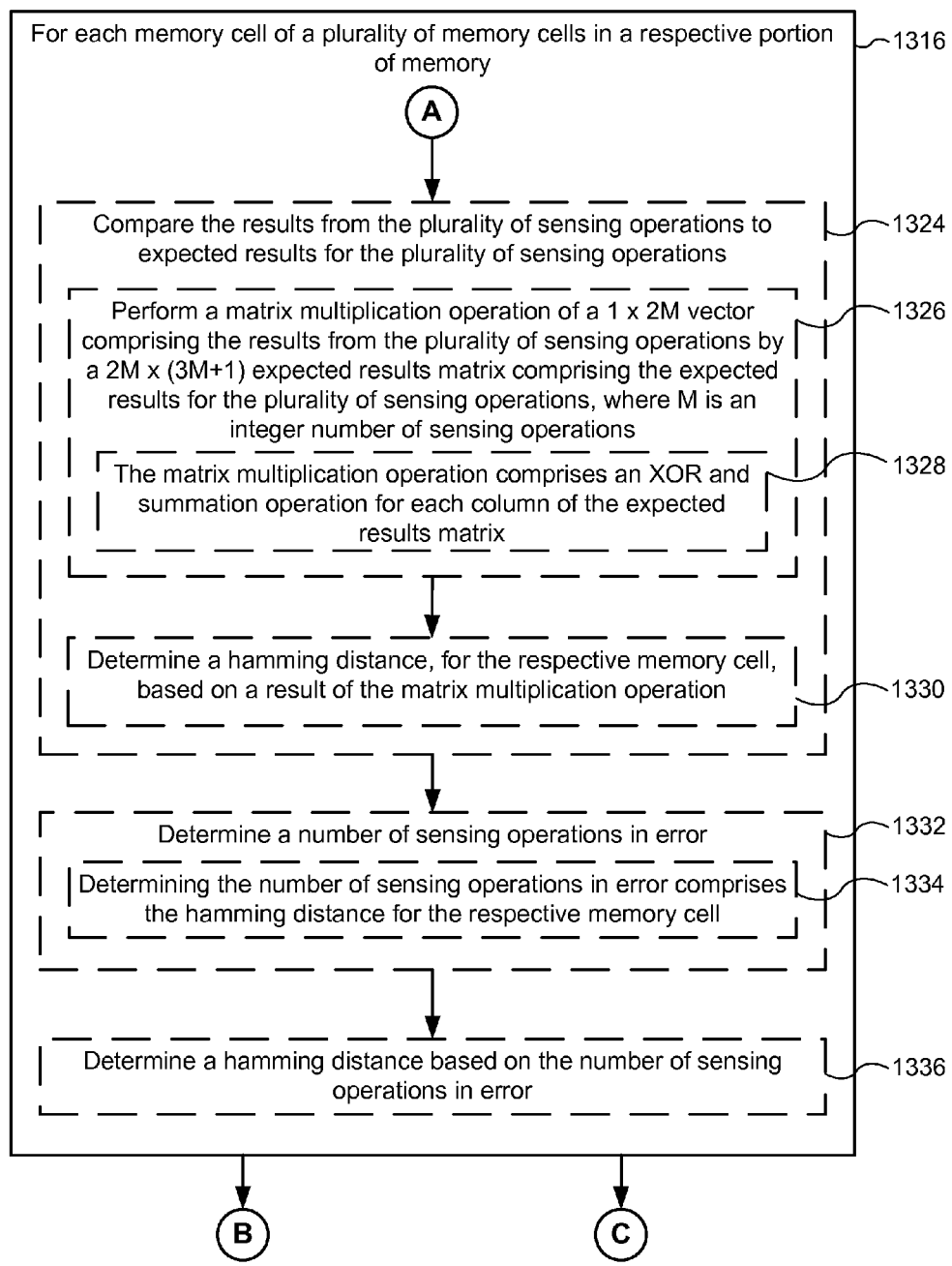
Figure 13C:
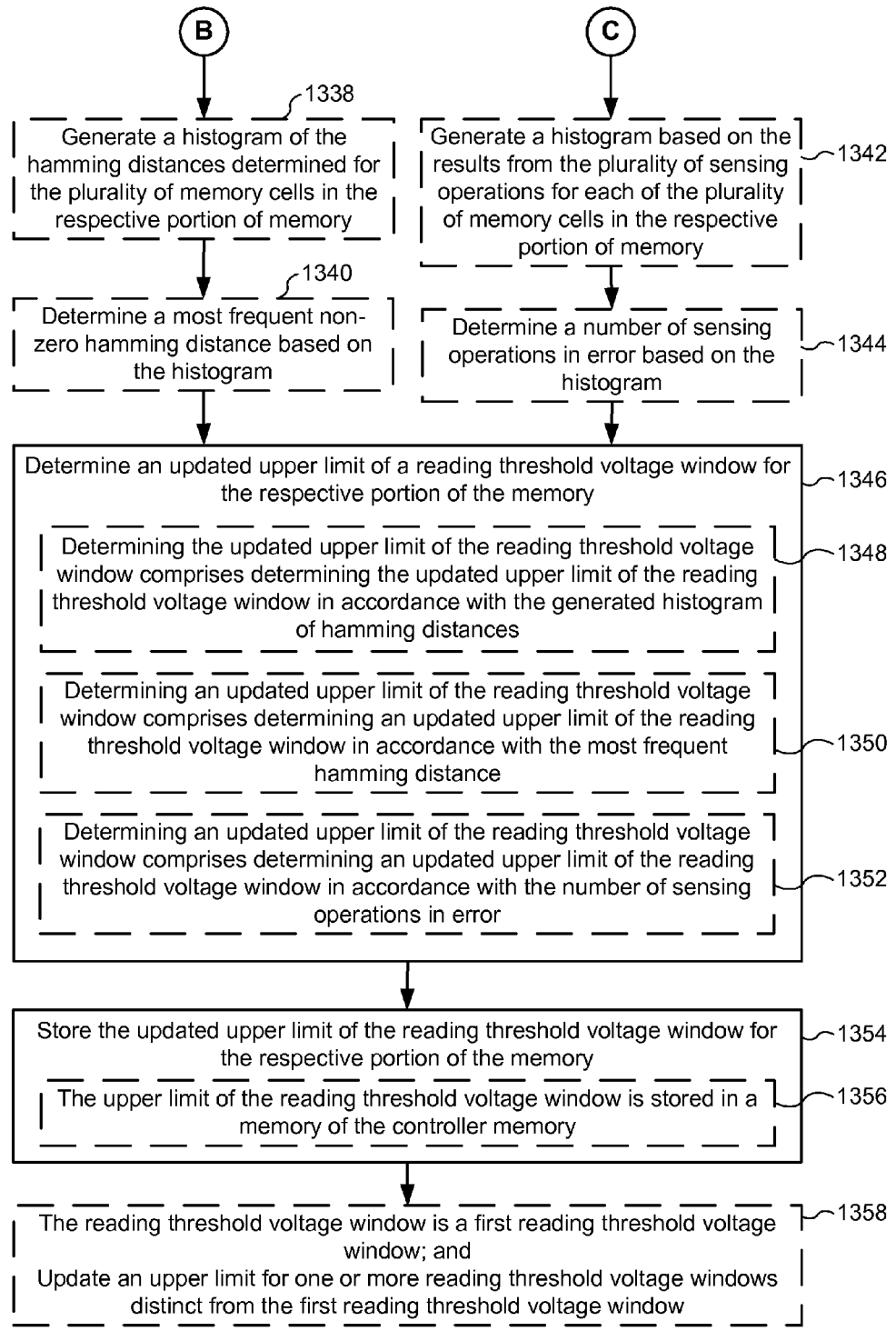

FIGS. 13A-C illustrate a flowchart representation of a method 1300 of updating an upper limit of a reading threshold voltage window for a respective portion of a storage medium (e.g., a distinct die, block zone, block, word line, word line zone or page portion of storage medium 130 in FIG. 1). In some embodiments, method 1300 is performed by a memory controller (e.g., memory controller 120 in FIG. 1) distinct from and coupled to the storage medium (e.g., storage medium 130 in FIG. 1) by one or more connections (e.g., connections 103 in FIG. 1).

At least in some implementations, method 1300 is performed by a memory controller (e.g., memory controller 120 in FIG. 1), or one or more components of the memory controller (e.g., management module 121 in FIGS. 1 and 2A), or one or more sub-components of the memory controller (e.g., reading threshold voltage window update module 220), or a combination thereof. In some embodiments, method 1300 is governed by instructions that are stored in a non-transitory computer readable storage medium and the instructions are executed by one or more processors of a device, such as the one or more processing units (CPUs) 122 of management module 121, shown in FIGS. 1 and 2A.

In some embodiments, a memory controller performs (1302) read patrol operations in accordance with a predefined schedule. For example, the memory controller is configured to perform read patrol operations (including adjusting one or more reading threshold voltages) every twelve hours, day, week, fortnight, month, and so on. In some embodiments, the memory controller performs (1304) read patrol operations after a predefined number of program-erase (PE) cycles have been performed on a respective portion of the storage medium. For example, the memory controller is configured to perform read patrol operations (including adjusting one or more reading threshold voltages) after the respective portion of the storage medium has undergone a predefined number PE cycles (e.g., 1000, 10000, etc.).

In some embodiments, the memory controller adjusts (1306) one or more reading threshold voltages associated with the respective portion of the storage medium during read patrol operations. In response to an indication from adjustment trigger module 219 that a predefined condition has occurred (e.g., an ECC failure, a predefined count of PE cycles, a scheduled time), the memory controller is configured to adjust one or more reading threshold voltages for the respective portion of the storage medium with reading threshold voltage adjustment module 218. For example, the memory controller is further configured to store the one or more adjusted reading threshold voltages, or update the existing value(s), as a characterization parameter value (e.g., in field 232) of a characterization vector 211 corresponding to the respective portion of the storage medium.

In some embodiments, the memory controller detects (1308) a predefined LM flag issue after adjusting one or more reading threshold voltages. After adjusting one or more reading threshold voltages, the memory controller is configured to detect the predefined LM flag issue with update trigger module 222. For example, the memory controller detects the predefined LM flag issue when a number of bits read with the one or more adjusted reading threshold voltages indicate over a threshold amount of invalid bit mappings (e.g., 15%, 20%, 25%).

In some embodiments, the memory controller detects (1310) a predefined LM flag issue in a last programmed word line in an open block of the respective portion of the storage medium. As discussed with reference to FIG. 6, in some embodiments, the memory controller is configured to detect the predefined LM flag issue in only the last programmed word line in an open block of the respective portion of the storage medium. In some other embodiments, the memory controller is configured to detect the predefined LM flag issue in all word lines in an open block of the respective portion of the storage medium. In some embodiments, the memory controller is configured to detect the predefined LM flag issue in all word lines of open or closed blocks of the respective portion of the storage medium.

In some embodiments, the memory controller determines (1312) that a codeword cannot be decoded and detects (1314) a predefined LM flag issue after determining that the codeword cannot be decoded. For example, the memory controller adjusts one or more reading threshold voltages after determining that a codeword cannot be decoded. If the memory controller determines that the codeword cannot be read after reading the codeword with the one or more adjusted reading threshold voltages, then the memory controller detects an LM flag issue.

For each memory cell (1316) of a plurality of memory cells in the respective portion of the storage medium, the memory controller performs (1318) a plurality of sensing operations, where the plurality of sensing operations includes sensing operations using a predefined range of offsets from a previously established reading threshold voltage. The memory controller is configured to perform a plurality of sensing operations with sensing module 224 on the memory cells in the respective portion of the storage medium. The plurality of sensing operations are performed over a predefined range of voltages relative to a previously established threshold voltage in accordance with a predefined voltage step. In FIG. 7, for example, twenty-one sensing operations are performed on a respective memory cell within +/−500 mV of $V_{RB}$. The twenty-one sensing operations, or offsets from $V_{RB}$, are performed in 50 mV steps starting with −500 mV relative to $V_{RB}$ and ending with +500 mV relative to $V_{RB}$.

In some embodiments, the memory controller performs (1320) the plurality of sensing operations in response to detecting the predefined LM flag issue. In response to detecting the predefined LM flag issue (e.g., with update trigger module 222), the memory controller is configured to perform the plurality of sensing operations with sensing module 224 on the memory cells in the respective portion of the storage medium.

For each memory cell (1316) of the plurality of memory cells in the respective portion of the storage medium, the memory controller obtains (1322) the results from the plurality of sensing operations. For example, management module 121 (or more specifically, reading threshold voltage window update module 220) is configured to obtain the results from the plurality of sensing operations performed on the memory cells in the respective portion of the storage medium from storage medium I/O 128.

In some embodiments, for each memory cell (1316) of the plurality of memory cells in the respective portion of the storage medium, the memory controller compares (1324) the results from the plurality of sensing operations to expected results for the plurality of sensing operations. In some embodiments, the comparing comprises performing (1326) a matrix multiplication operation of a 1×2M vector comprising the results from the plurality of sensing operations by a 2M× (3M+1) expected results matrix comprising the expected results for the plurality of sensing operations, where M is an integer number of sensing operations. The memory controller is configured to perform the matrix multiplication operations with analytics module 226.

For 2-bit MLC, the results from the plurality of sensing operations on a respective memory cell produce a 1×2M vector with M upper page bits and M lower page bits. For example, in FIG. 9A, results vector 902 is a 1×14 vector of exemplary results from seven sensing operations performed on a respective 2-bit MLC. For 2-bit MLC, the expected results matrix is a 2M×(3M+1) matrix. FIG. 8B, for example, shows expected results matrix 850 with dimensions 14×22 for seven sensing operations (or M=7). In some embodiments, the matrix multiplication operation comprises (1328) an XOR and summation operation for each column of the expected results matrix. FIG. 9A, for example, shows matrix 908 which includes the results from XOR-ing results vector 902 with each column of expected results matrix 850. In some embodiments, the XOR operations are performed via 2M× (3M+1) XOR gates. FIG. 9A, for example, further shows vector 910 which is the results of arithmetically summing the columns of matrix 908. In some embodiments, the comparing comprises determining (1330) a hamming distance, for the respective memory cell, based on a result of the matrix multiplication operation. The memory controller is configured to determine a hamming distance (sometimes also called a minimum hamming distance) for each memory cell in the respective portion of the storage medium with analytics module 226. For example, in FIG. 9A, the memory controller determines that the hamming distance (or minimum hamming distance) for the respective 2-bit MLC is 2 by selecting the minimum value (e.g., value 912 or 914) in vector 910.

In some embodiments, the memory controller determines (1332) a number of sensing operations in error. In some embodiments, determining the number of sensing operations in error comprises (1334) the hamming distance for the respective memory cell. In FIG. 9A, for example, the memory controller determines that two sensing operations are in error based on the minimum hamming distance selected from vector 910. In FIG. 11B, for example, the memory controller determines that one sensing operation is in error based on the lack of convexity in probability mass function (PMF) 1120 around point 1107b.

In some embodiments, the memory controller determines (1336) a hamming distance for each memory cell of a plurality of memory cells in the respective portion of the storage medium based on the number of sensing operations in error.

In some embodiments, the memory controller generates (1338) a histogram of the hamming distances determined for the plurality of memory cells in the respective portion of the storage medium. Optionally, hamming distances have a value of zero are excluded when generating the histogram. FIG. 9B, for example, shows hamming distance histogram 920 for a respective portion of the storage medium (with zero hamming distances excluded). In some embodiments, the memory controller determines (1340) a most frequent non-zero hamming distance based on the histogram of the hamming distances. For example, the memory controller determines a most frequent non-zero hamming distance (e.g., bar 922 corresponding to bin 2) based on hamming distance histogram 920 in FIG. 9B.

In some embodiments, the memory controller generates (1342) a histogram based on the results from the plurality of sensing operations for each of the plurality of memory cells in the respective portion of the storage medium. For example, FIGS. 11A-C show PMFs 1110, 1120, 1130 which are histograms indicating the number of memory cells with a reading threshold voltage corresponding to the sensing points on the x-axis. In some embodiments, the memory controller determines (1344) a number of sensing operations in error based on the histogram generated from the plurality of sensing operations for each of the plurality of memory cells in the respective portion of the storage medium. In FIG. 11B, for example, the memory controller determines that one sensing operation (or, alternatively, at least one sensing operation) is in error based on the lack of convexity in PMF 1120 around point 1107b.

The memory controller determines (1346) an updated upper limit of the reading threshold voltage window based on the results from the plurality of sensing operations performed on the plurality of memory cells in the respective portion of the storage medium.

In some embodiments, determining the updated upper limit of the reading threshold voltage window comprises (1348) determining the updated upper limit of the reading threshold voltage window in accordance with the generated histogram of hamming distances. In some embodiments, determining an updated upper limit of the reading threshold voltage window comprises (1350) determining the updated upper limit of the reading threshold voltage window in accordance with the most frequent hamming distance. In FIG. 9B, for example, the memory controller determines that the updated upper limit of the reading threshold voltage window is 100 mV lower than the previously established upper limit of the reading threshold voltage window based on the most frequent hamming distance, two, in hamming distance histogram 920. The memory controller determines that the most frequent hamming distance is two because bar 922 indicates that the number of memory cells with a hamming distance of two is the most frequent. Furthermore, the updated upper limit of the reading threshold voltage window is determined by multiplying the most frequent hamming distance (e.g., two) by the step voltage (e.g., 50 mV) and subtracting the resulting offset from the previously established upper limit of the reading threshold voltage window. In some embodiments, determining the updated upper limit of the reading threshold voltage window comprises (1352) determining the updated upper limit of the reading threshold voltage window in accordance with the number of sensing operations in error. For example, the memory controller determines that the updated upper limit of the reading threshold voltage window for $V_{RB}$ is the voltage corresponding to point 1106b based on PMF 1120 in FIG. 11B. FIG. 11B, for example, shows that PMF 1120 loses its convexity around point 1107b; thus, the updated upper limit of the reading threshold voltage window for $V_{RB}$ is the voltage corresponding to point 1106b where PMF 1120 remains convex.

The memory controller stores (1354) the updated upper limit of the reading threshold voltage window for the respective portion of the storage medium. For example, the memory controller stores the updated upper limit of the reading threshold voltage window for the respective portion of the storage medium as a characterization parameter value (e.g., in field 234) in a characterization vector 211 corresponding to the respective portion of the storage medium. In some embodiments, the upper limit of the reading threshold voltage window is stored (1356) in a memory of the memory controller. For example, the updated upper limit of the reading threshold voltage window for the respective portion of the storage medium is stored as a characterization parameter value (e.g., in field 234) in a characterization vector 211 corresponding to the respective portion of the storage medium, and characterization vector 211 is stored in characterization vector table 210. In some embodiments, characterization vector table 210 is stored in management module memory 206. In some other embodiments, characterization vector table 210 is stored in memory outside of management module 121.

In some embodiments, the reading threshold voltage window is a first reading threshold voltage window, and the memory controller further updates (1358) an upper limit for one or more reading threshold voltage windows distinct from the first reading threshold voltage window. For example, after adjusting the upper limit of the first reading threshold voltage window (e.g., associated with $V_{RB}$), the memory controller is configured to adjust the upper limit of the second and third reading threshold voltage windows (e.g., associated with $V_{RA}$ and $V_{RC}$, respectively).

It will be understood that, although the terms "first," "second," etc. may be used herein to describe various elements, these elements should not be limited by these terms. These terms are only used to distinguish one element from another. For example, a first reading threshold voltage could be termed a second reading threshold voltage, and, similarly, a second reading threshold voltage could be termed a first reading threshold voltage, which changing the meaning of the description, so long as all occurrences of the "first reading threshold voltage" are renamed consistently and all occurrences of the second reading threshold voltage are renamed consistently. The first reading threshold voltage and the second reading threshold voltage are both reading threshold voltages, but they are not the same reading threshold voltage.

The terminology used herein is for the purpose of describing particular embodiments only and is not intended to be limiting of the claims. As used in the description of the embodiments and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific implementations. However, the illustrative discussions above are not intended to be exhaustive or to limit the claims to the precise forms disclosed. Many modifications and variations are possible in view of the above teachings. The implementations were chosen and described in order to best explain principles of operation and practical applications, to thereby enable others skilled in the art.

What is claimed is:

1. A method performed by a memory controller of updating an upper limit of a reading threshold voltage window for a respective portion of a storage medium, the method comprising:
 during read patrol operations, adjusting one or more reading threshold voltages associated with the respective portion of the storage medium;
 after adjusting the one or more reading threshold voltages, detecting a predefined lower-middle (LM) flag issue; and
 in response to detecting the LM flag issue, performing a sequence of operations comprising:
 for each memory cell of a plurality of memory cells in the respective portion of the storage medium:
  performing a plurality of sensing operations, wherein the plurality of sensing operations includes sensing operations using a predefined range of offsets from a previously established reading threshold voltage; and
  obtaining results from the plurality of sensing operations;
 determining an updated upper limit of the reading threshold voltage window based on the results from the plurality of sensing operations performed on the plurality of memory cells in the respective portion of the storage medium; and
 storing the updated upper limit of the reading threshold voltage window for the respective portion of the storage medium.

2. The method of claim 1, further comprising, for each memory cell of the plurality of memory cells in the respective portion of the storage medium:
 comparing the results from the plurality of sensing operations to expected results for the plurality of sensing operations; and
 determining a number of sensing operations in error.

3. The method of claim 2, wherein comparing the results comprises:
 performing a matrix multiplication operation of a 1×2M vector comprising the results from the plurality of sensing operations by a 2M×(3M+1) expected results matrix comprising the expected results for the plurality of sensing operations, wherein M is an integer number of sensing operations; and
 determining a hamming distance, for the respective memory cell, based on a result of the matrix multiplication operation.

4. The method of claim 3, wherein:
 the matrix multiplication operation comprises an XOR and summation operation for each column of the expected results matrix;
 determining the number of sensing operations in error comprises the hamming distance for the respective memory cell;
 generating a histogram of the hamming distances determined for the plurality of memory cells in the respective portion of the storage medium; and
 determining the updated upper limit of the reading threshold voltage window comprises determining the updated upper limit of the reading threshold voltage window in accordance with the generated histogram of hamming distances.

5. The method of claim 2, further comprising:
 for each memory cell of the plurality of memory cells in the respective portion of the storage medium, determining a hamming distance based on the number of sensing operations in error;
 generating a histogram of the hamming distances determined for the plurality of memory cells in the respective portion of the storage medium; and
 wherein determining the updated upper limit of the reading threshold voltage window comprises determining the updated upper limit of the reading threshold voltage window in accordance with the generated histogram of hamming distances.

6. The method of claim 5, further comprising determining a most frequent non-zero hamming distance based on the histogram; and
 wherein determining an updated upper limit of the reading threshold voltage window comprises determining the updated upper limit of the reading threshold voltage window in accordance with the most frequent non-zero hamming distance.

7. The method of claim 1, further comprising:
 generating a histogram based on the results from the plurality of sensing operations for each of the plurality of memory cells in the respective portion of the storage medium;
 determining a number of sensing operations in error based on the histogram; and
 wherein determining the updated upper limit of the reading threshold voltage window comprises determining the updated upper limit of the reading threshold voltage window in accordance with the number of sensing operations in error.

8. The method of claim 1, wherein the read patrol operations are performed after a predefined number of PE cycles have been performed on the respective portion of the storage medium.

9. The method of claim 1, wherein the read patrol operations are performed in accordance with a predefined schedule.

10. The method of claim 1, wherein detecting the predefined LM flag issue comprises detecting the predefined LM flag issue in a last programmed word line in an open block of the respective portion of the storage medium.

11. The method of claim 1, further comprising:
 determining that a codeword cannot be decoded;
 after determining that the codeword cannot be decoded, detecting the predefined LM flag issue; and
 wherein performing the plurality of sensing operations for each memory cell of the plurality of memory cells in the respective portion of the storage medium comprises performing the plurality of sensing operations in response to detecting the LM flag issue.

12. The method of claim 1, wherein the upper limit of the reading threshold voltage window is stored in a memory of the memory controller.

13. The method of claim 1, wherein the reading threshold voltage window is a first reading threshold voltage window; and
 the method further comprising updating an upper limit for one or more reading threshold voltage windows distinct from the first reading threshold voltage window.

14. A memory controller for updating an upper limit of a reading threshold voltage window for a respective portion of a storage medium, the memory controller comprising:
- a storage medium interface for coupling the memory controller to the storage medium; and
- one or more modules, including a management module that includes one or more processors and memory storing one or more programs configured for execution by the one or more processors, the one or more modules coupled to the storage medium interface and configured to:
  - during read patrol operations, adjust one or more reading threshold voltages associated with the respective portion of the storage medium;
  - after adjusting the one or more reading threshold voltages, detect a predefined lower-middle (LM) flag issue; and
  - respond to detecting the LM flag issue by performing a sequence of operations comprising:
    - for each memory cell of a plurality of memory cells in the respective portion of the storage medium:
      - perform a plurality of sensing operations, wherein the plurality of sensing operations includes sensing operations using a predefined range of offsets from a previously established reading threshold voltage; and
      - obtain results from the plurality of sensing operations;
    - determine an updated upper limit of the reading threshold voltage window based on the results from the plurality of sensing operations performed on the plurality of memory cells in the respective portion of the storage medium; and
    - store the updated upper limit of the reading threshold voltage window for the respective portion of the storage medium.

15. The memory controller of claim 14, wherein the one or more modules are further configured to:
- for each memory cell of the plurality of memory cells in the respective portion of the storage medium:
  - compare the results from the plurality of sensing operations to expected results for the plurality of sensing operations; and
  - determine a number of sensing operations in error.

16. The memory controller of claim 15, wherein comparing the results comprises:
- performing a matrix multiplication operation of a 1×2M vector comprising the results from the plurality of sensing operations by a 2M×(3M+1) expected results matrix comprising the expected results for the plurality of sensing operations, wherein M is an integer number of sensing operations; and
- determining a hamming distance, for the respective memory cell, based on a result of the matrix multiplication operation.

17. The memory controller of claim 16, wherein:
- the matrix multiplication operation comprises an XOR and summation operation for each column of the expected results matrix;
- determining the number of sensing operations in error comprises the hamming distance for the respective memory cell;
- the one or more modules are further configured to generate a histogram of the hamming distances determined for the plurality of memory cells in the respective portion of the storage medium; and
- determining the updated upper limit of the reading threshold voltage window comprises determining the updated upper limit of the reading threshold voltage window in accordance with the generated histogram of hamming distances.

18. The memory controller of claim 15, wherein the one or more modules are further configured to:
- for each memory cell of the plurality of memory cells in the respective portion of the storage medium, determine a hamming distance based on the number of sensing operations in error;
- generate a histogram of the hamming distances determined for the plurality of memory cells in the respective portion of the storage medium; and
- wherein determining the updated upper limit of the reading threshold voltage window comprises determining the updated upper limit of the reading threshold voltage window in accordance with the generated histogram of hamming distances.

19. The memory controller of claim 18, wherein the one or more modules are further configured to determine a most frequent non-zero hamming distance based on the histogram; and
- wherein determining an updated upper limit of the reading threshold voltage window comprises determining the updated upper limit of the reading threshold voltage window in accordance with the most frequent non-zero hamming distance.

20. The memory controller of claim 14, wherein the one or more modules are further configured to:
- generate a histogram based on the results from the plurality of sensing operations for each of the plurality of memory cells in the respective portion of the storage medium;
- determine a number of sensing operations in error based on the histogram; and
- wherein determining the updated upper limit of the reading threshold voltage window comprises determining the updated upper limit of the reading threshold voltage window in accordance with the number of sensing operations in error.

21. The memory controller of claim 14, wherein the read patrol operations are performed after a predefined number of PE cycles have been performed on the respective portion of the storage medium.

22. The memory controller of claim 14, wherein the read patrol operations are performed in accordance with a predefined schedule.

23. The memory controller of claim 14, wherein detecting the predefined LM flag issue comprises detecting the predefined LM flag issue in a last programmed word line in an open block of the respective portion of the storage medium.

24. The memory controller of claim 14, wherein the one or more modules are further configured to:
- determine that a codeword cannot be decoded;
- after determining that the codeword cannot be decoded, detect the predefined LM flag issue; and
- wherein performing the plurality of sensing operations for each memory cell of the plurality of memory cells in the respective portion of the storage medium comprises performing the plurality of sensing operations in response to detecting the LM flag issue.

25. The memory controller of claim 14, wherein the upper limit of the reading threshold voltage window is stored in the memory of the management module.

26. The memory controller of claim 14, wherein the reading threshold voltage window is a first reading threshold voltage window; and
- the one or more modules are further configured to update an upper limit for one or more reading threshold voltage windows distinct from the first reading threshold voltage window.

27. A memory controller for updating an upper limit of a reading threshold voltage window for a respective portion of a storage medium, the memory controller comprising:
- a storage medium interface for coupling the memory controller to the storage medium; and
- means for adjusting one or more reading threshold voltages associated with the respective portion of the storage medium during read patrol operations;
- means for detecting a predefined lower-middle (LM) flag issue after adjusting the one or more reading threshold voltages; and
- means for performing a sequence of operations in response to detecting the LM flag issue, the sequence of operations comprising:
  - performing a plurality of sensing operations, for each memory cell of a plurality of memory cells in the respective portion of the storage medium, and obtaining results from the plurality of sensing operations, wherein the plurality of sensing operations includes sensing operations using a predefined range of offsets from a previously established reading threshold voltage; and
  - determining an updated upper limit of the reading threshold voltage window based on the results from the plurality of sensing operations performed on the plurality of memory cells in the respective portion of the storage medium, and
  - storing the updated upper limit of the reading threshold voltage window for the respective portion of the storage medium.

28. The memory controller of claim 27, wherein the sequence of operations further comprises:
- for each memory cell of the plurality of memory cells in the respective portion of the storage medium,
  - comparing the results from the plurality of sensing operations to expected results for the plurality of sensing operations;
  - determining a number of sensing operations in error; and
  - determining a hamming distance based on the number of sensing operations in error;
- wherein determining the updated upper limit of the reading threshold voltage window comprises determining the updated upper limit of the reading threshold voltage window in accordance with the hamming distances determined for the plurality of memory cells in the respective portion of the storage medium.

29. The memory controller of claim 27, further comprising:
- means for determining that a codeword cannot be decoded;
- wherein the means for detecting the LM flag issue detects the LM flag issue in accordance with a determination that the codeword cannot be decoded.

* * * * *

UNITED STATES PATENT AND TRADEMARK OFFICE
CERTIFICATE OF CORRECTION

| | | |
|---|---|---|
| PATENT NO. | : 9,159,437 B2 | Page 1 of 1 |
| APPLICATION NO. | : 13/924313 | |
| DATED | : October 13, 2015 | |
| INVENTOR(S) | : Jeon et al. | |

It is certified that error appears in the above-identified patent and that said Letters Patent is hereby corrected as shown below:

On the title page item 57 Abstract, line 13, please delete "the-results" and insert --the results--.

Signed and Sealed this
Twenty-third Day of February, 2016

Michelle K. Lee
*Director of the United States Patent and Trademark Office*